(12) United States Patent
Shao et al.

(10) Patent No.: US 12,500,139 B2
(45) Date of Patent: Dec. 16, 2025

(54) PACKAGE WITH HEAT DISSIPATION STRUCTURE AND METHOD FOR FORMING THE SAME

(71) Applicant: Taiwan Semiconductor Manufacturing Co., Ltd., Hsinchu (TW)

(72) Inventors: Tung-Liang Shao, Hsinchu (TW); You-Rong Shaw, Hsinchu (TW); Yu-Sheng Huang, Hemei Township (TW); Chen-Hua Yu, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 430 days.

(21) Appl. No.: 18/152,463

(22) Filed: Jan. 10, 2023

(65) Prior Publication Data

US 2024/0145342 A1  May 2, 2024

(51) Int. Cl.
| | |
|---|---|
| H01L 23/473 | (2006.01) |
| H01L 21/48 | (2006.01) |
| H01L 21/56 | (2006.01) |
| H01L 23/00 | (2006.01) |
| H01L 23/31 | (2006.01) |
| H01L 25/065 | (2023.01) |

(52) U.S. Cl.
CPC ........ *H01L 23/473* (2013.01); *H01L 21/4878* (2013.01); *H01L 21/565* (2013.01); *H01L 23/315* (2013.01); *H01L 24/16* (2013.01); *H01L 24/32* (2013.01); *H01L 24/73* (2013.01); *H01L 24/83* (2013.01); *H01L 25/0652* (2013.01); *H01L 2224/16235* (2013.01); *H01L 2224/32225* (2013.01); *H01L 2224/32245* (2013.01); *H01L 2224/73204* (2013.01); *H01L 2224/83359* (2013.01); *H01L 2924/1632* (2013.01)

(58) Field of Classification Search
CPC . H01L 23/473; H01L 23/315; H01L 25/0652; H01L 2924/1632
See application file for complete search history.

(56) References Cited

U.S. PATENT DOCUMENTS

| 5,844,311 A | * | 12/1998 | Watanabe | ............. | H01L 23/433 |
| | | | | | 257/E23.09 |
| 7,808,781 B2 | * | 10/2010 | Colgan | ................. | H01L 23/473 |
| | | | | | 257/714 |

(Continued)

FOREIGN PATENT DOCUMENTS

CN        112635417 A      4/2021

*Primary Examiner* — Peniel M Gumedzoe
(74) *Attorney, Agent, or Firm* — Slater Matsil, LLP

(57) ABSTRACT

In an embodiment, a package includes an encapsulant laterally surrounding a first integrated circuit device and a second integrated circuit device, wherein the first integrated circuit device includes a die and a heat dissipation structure over the die; a sealant disposed over the heat dissipation structure; an adhesive disposed over the second integrated circuit device; and a lid disposed over the sealant and the adhesive, wherein the lid includes a first cooling passage and a second cooling passage, the first cooling passage including an opening at a bottom of the lid and aligned to the heat dissipation structure, the second cooling passage including channels aligned to the second integrated circuit device and being distant from the bottom of the lid.

20 Claims, 24 Drawing Sheets

(56) References Cited

U.S. PATENT DOCUMENTS

| | | | |
|---|---|---|---|
| 2006/0180924 A1* | 8/2006 | Andry | H01L 23/473 257/E23.098 |
| 2020/0105644 A1 | 4/2020 | Teng et al. | |
| 2023/0124783 A1* | 4/2023 | Kim | H01L 25/105 257/712 |

* cited by examiner

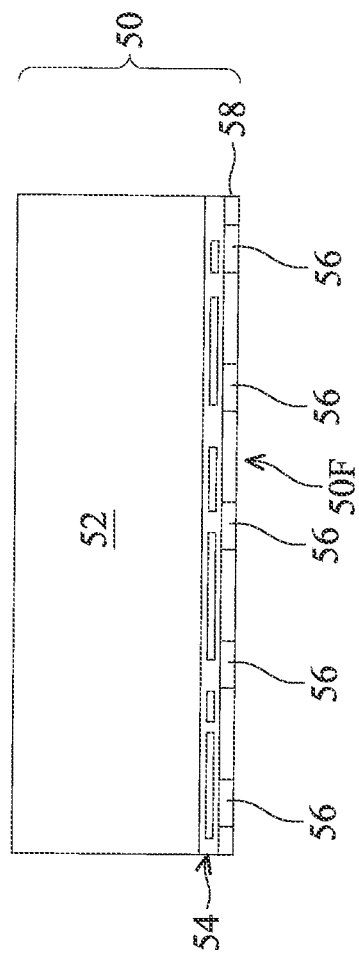

PACKAGE WITH HEAT DISSIPATION STRUCTURE AND METHOD FOR FORMING THE SAME

PRIORITY CLAIM AND CROSS-REFERENCE

This application claims the benefit of U.S. Provisional Application No. 63/419,607, filed on Oct. 26, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a cross-sectional view of an integrated circuit die, in accordance with some embodiments.

DETAILED DESCRIPTION

Figure 2A:
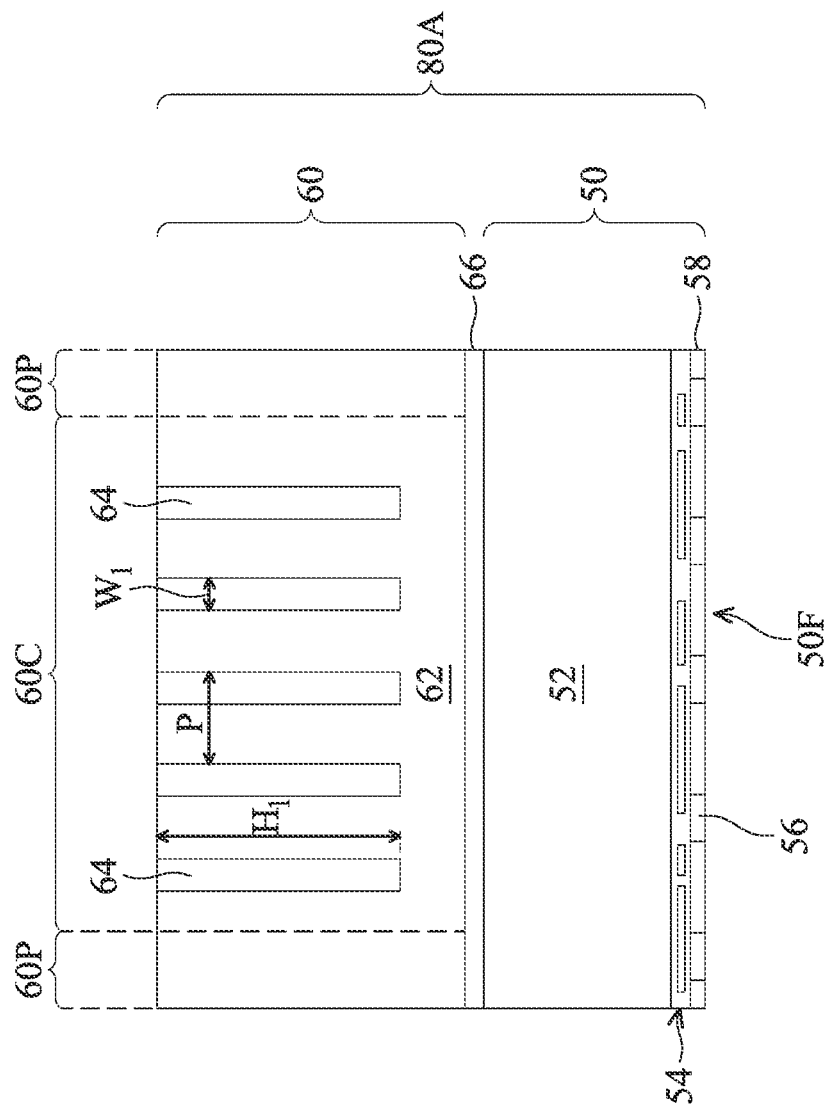
FIGS. 2A and 2B are a cross-sectional view and a plan view of an integrated circuit device, respectively, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a package includes a lid structure disposed over integrated circuit devices. The lid structure includes cooling passages for allowing cooling fluid to flow through for dissipating heat generated by the integrated circuit devices, thereby improving the performance of the package.

FIG. 1 is a cross-sectional view of an integrated circuit die 50. One or more integrated circuit dies 50 will be packaged in subsequent processing to form integrated circuit packages. Each integrated circuit die 50 may be a logic die (e.g., central processing unit (CPU), graphics processing unit (GPU), microcontroller, etc.), a memory die (e.g., dynamic random access memory (DRAM) die, static random access memory (SRAM) die, hybrid memory cube (HMC) module, a high bandwidth memory (HBM) module, etc.), a power management die (e.g., power management integrated circuit (PMIC) die), a radio frequency (RF) die, an interface die, a sensor die, a micro-electro-mechanical-system (MEMS) die, a signal processing die (e.g., digital signal processing (DSP) die), a front-end die (e.g., analog front-end (AFE) dies), an application-specific integrated circuit (ASIC) die, the like, or combinations thereof (e.g., a system-on-a-chip (SoC) die). The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58 (if present).

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing downward in FIG. 1) and an inactive surface (e.g., the surface facing upward in FIG. 1). Devices are at the active surface of the semiconductor substrate 52. The devices may be active devices (e.g., transistors, diodes, etc.) and/or passive devices (e.g., capacitors, resistors, etc.). The inactive surface may be free from devices.

The interconnect structure 54 is on the active surface of the semiconductor substrate 52, and is used to electrically connect the devices of the semiconductor substrate 52 to form an integrated circuit. The interconnect structure 54 may include one or more dielectric layer(s) and respective one or more metallization layer(s) in the dielectric layer(s). Acceptable dielectric materials for the dielectric layers include an oxide, a nitride, a carbide, or a combination thereof. For example, the dielectric material may include silicon oxide, aluminum oxide, silicon nitride, silicon oxynitride, silicon carbide, silicon oxycarbide, silicon carbonitride, silicon oxycarbonitride, a combination thereof, or the like. Other dielectric materials may also be used, such as a polymer such as polybenzoxazole (PBO), polyimide, a benzocyclobuten (BCB) based polymer, or the like. The metallization layer(s) may include conductive vias and/or conductive lines to interconnect the devices of the semiconductor substrate 52. The metallization layer(s) may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Die connectors 56 are at the front side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 can be formed of a metal, such as copper, aluminum, or the like, and can be formed by, for example, plating, or the like.

A dielectric layer 58 is optionally disposed at the front side 50F of the integrated circuit die 50. The dielectric layer 58 is in and/or on the interconnect structure 54. For example, the dielectric layer 58 may be an upper dielectric layer of the interconnect structure 54. The dielectric layer 58 laterally encapsulates the die connectors 56. The dielectric layer 58 may be an oxide, a nitride, a carbide, a polymer, the like, or a combination thereof. The dielectric layer 58 may be formed, for example, by spin coating, lamination, chemical vapor deposition (CVD), or the like. Initially, the dielectric layer 58 may bury the die connectors 56, such that the top surface of the dielectric layer 58 is above the top surfaces of the die connectors 56. The die connectors 56 are exposed through the dielectric layer 58 during the formation of the integrated circuit die 50. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. After the planarization process, top surfaces of the die connectors 56 and the dielectric layer 58 are coplanar (within process variations) and are exposed at the front side 50F of the integrated circuit die 50.

Figure 2B:
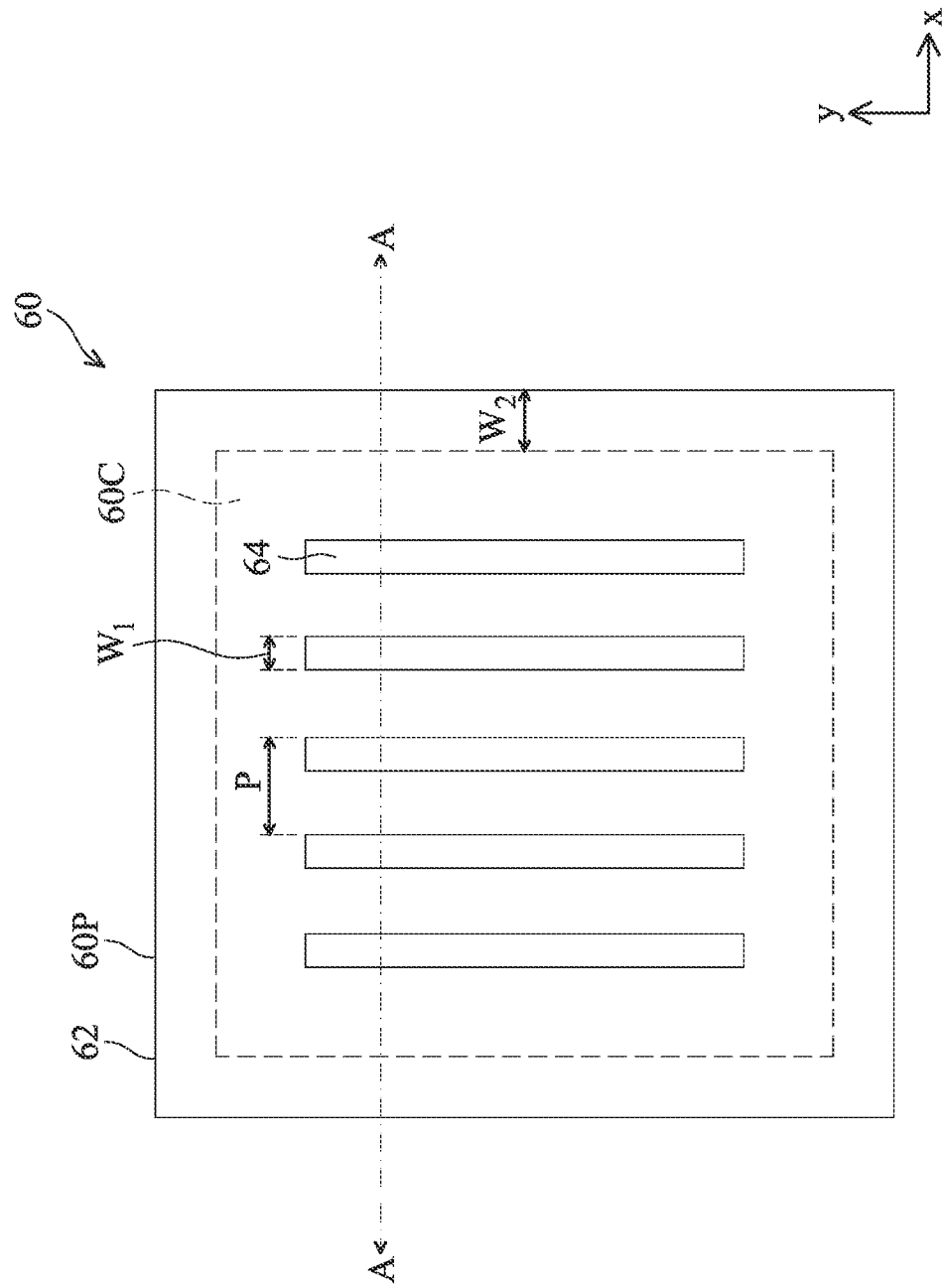

FIGS. 2A and 2B are a cross-sectional view and a plan view of a first integrated circuit device 80A, respectively, wherein FIG. 2A is taken along the A-A line in FIG. 2B, in accordance with some embodiments. The first integrated circuit device 80A may include a heat dissipation structure 60 attached to the integrated circuit die 50 (see, e.g., FIG. 1). In some embodiments, the heat dissipation structure 60 includes a bulk substrate 62 and may not include metallization layer(s), active or inactive devices, or the like. The bulk substrate 62 may be formed of a material with high thermal conductivity, such as silicon, a semiconductor material similar to the semiconductor substrate 52, or the like. The heat dissipation structure 60 may also be referred to as a dummy die or as a thermal enhancement die.

The heat dissipation structure 60 has a central area 60C adjacent to a peripheral area 60P in accordance with some embodiments. For example, as illustrated in FIG. 2B, the peripheral area 60P may have a ring shape in a plan view and surround the central area 60C. The plurality of strips 64 may be disposed within the central area 60C, and the peripheral area 60P is free of the strips 64. The strips 64 may extend along a longitudinal direction (e.g., into and out the plane of the cross-sectional view shown in FIG. 2A). The strips 64 may be formed in a regular pattern, such as a repeat pattern of rectangular strips as illustrated in FIG. 2B. For example, the adjacent strips 64 may have a pitch P in a range from 20 um to 166 um. In some embodiments, each of the strips 64 has a first width W1 in a range from 30 um to 100 um and a height (or depth) H1 in a range from 50 um to 600 um. A ratio of the height H1 to the width W1 may be in a range from 1 to 15. The regular pattern of strips is shown for illustrative purposes, and other patterns, regular or irregular, may be used. The strips 64 may be exposed from a top surface of the bulk substrate 62. The strips 64 may have a top surface coplanar with the top surface of the bulk substrate 62. In some embodiments, the strips 64 have straight sidewalls which are substantially perpendicular or inclined in respect to the top surface of the bulk substrate 62. In some embodiments, the strips 64 include a polymer material such as epoxy, polyacrylates, polyimide, or a combination thereof, or any material that can be suitably removed by an etching process from the bulk substrate 62.

In some embodiments, the peripheral area 60P has a width $W_2$, such as from an edge of the bulk substrate 62 or the scribe line (e.g., see scribe line 69 in FIG. 5) toward the central region along the x-direction or y-direction of FIG. 2B. For example, the width $W_2$ may be 100 um to 250 um. In some embodiments, the width $W_2$ is 1% to 50% of the width of the central area 60C (e.g., in the x-direction). As will be discussed in greater detail below, the material of the strips 64 will be removed to form micro-channels for allowing cooling fluid to flow through for dissipating heat. A suitable width $W_2$ of the peripheral area 60P may provide sufficient space for a sealant (see FIG. 19) to be formed in the peripheral area 60P, thereby able to effectively reduce or prevent the leakage of the cooling fluid.

The heat dissipation structure 60 may be attached to the integrated circuit die 50 through direct bonding or an adhesive layer. For example, in some embodiments in which the heat dissipation structure 60 is attached to the integrated circuit die 50 through direct bonding, a bottom surface of the heat dissipation structure 60 is directly bonded to the inactive surface of the integrated circuit die 50. In such embodiments, a bonding film 66 such as a silicon oxide layer may be formed on one or both of the bulk substrate 62 of the heat dissipation structure 60 and the semiconductor substrate 52 of the integrated circuit die 50 to aid in the bonding process. In embodiments in which the heat dissipation structure 60 is attached to the integrated circuit die 50 through an adhesive layer, the bonding film 66 may be a thermal interface material (TIM). The thermal interface material may be a polymeric material, solder paste, indium solder paste, or the like.

Figure 3:
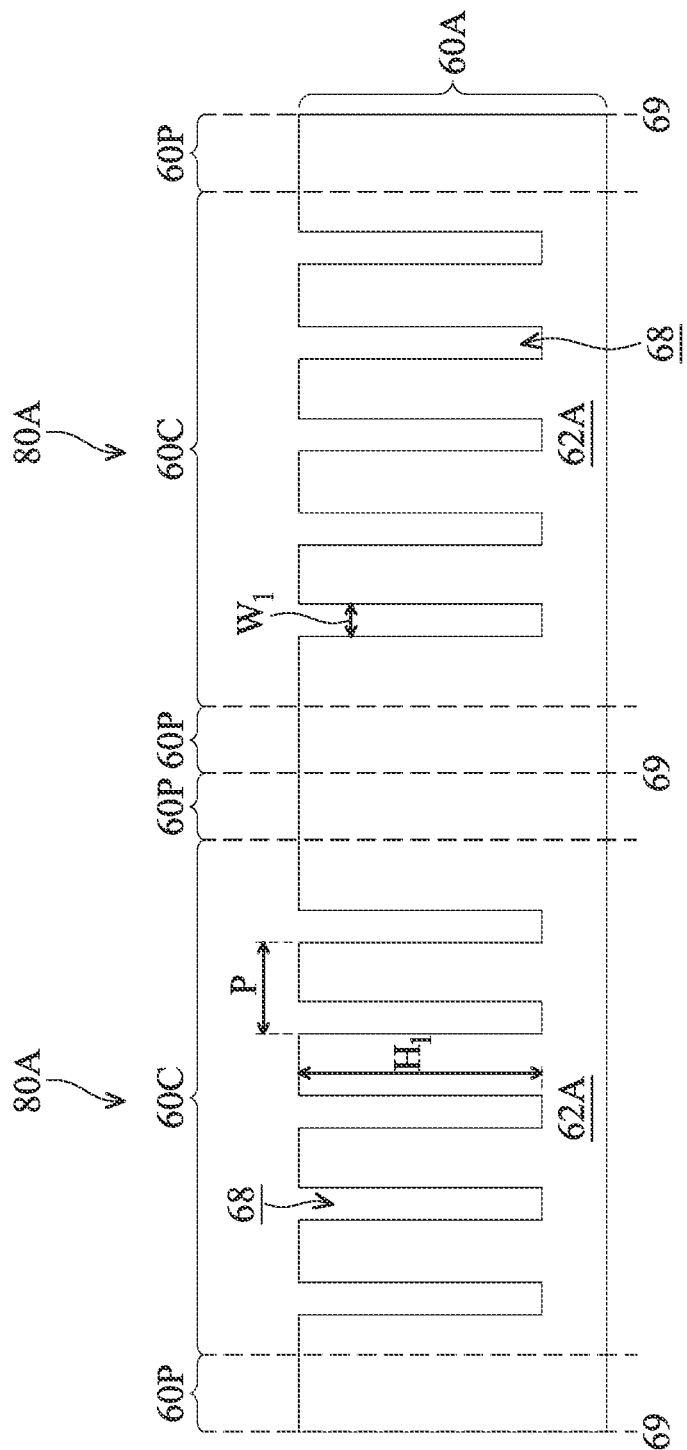
FIGS. 3-5 are cross-sectional views of intermediate stages in the manufacturing of an integrated circuit device, in accordance with some embodiments.
Figure 4:
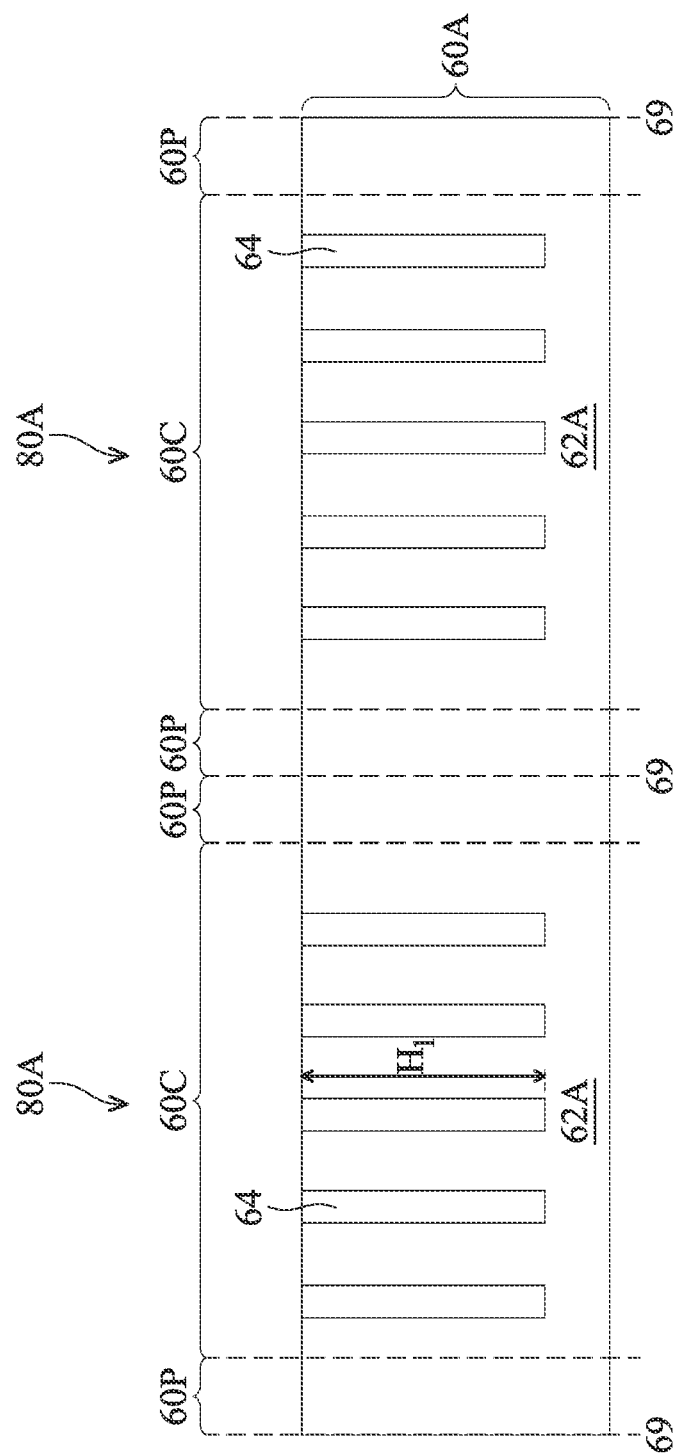
Figure 5:
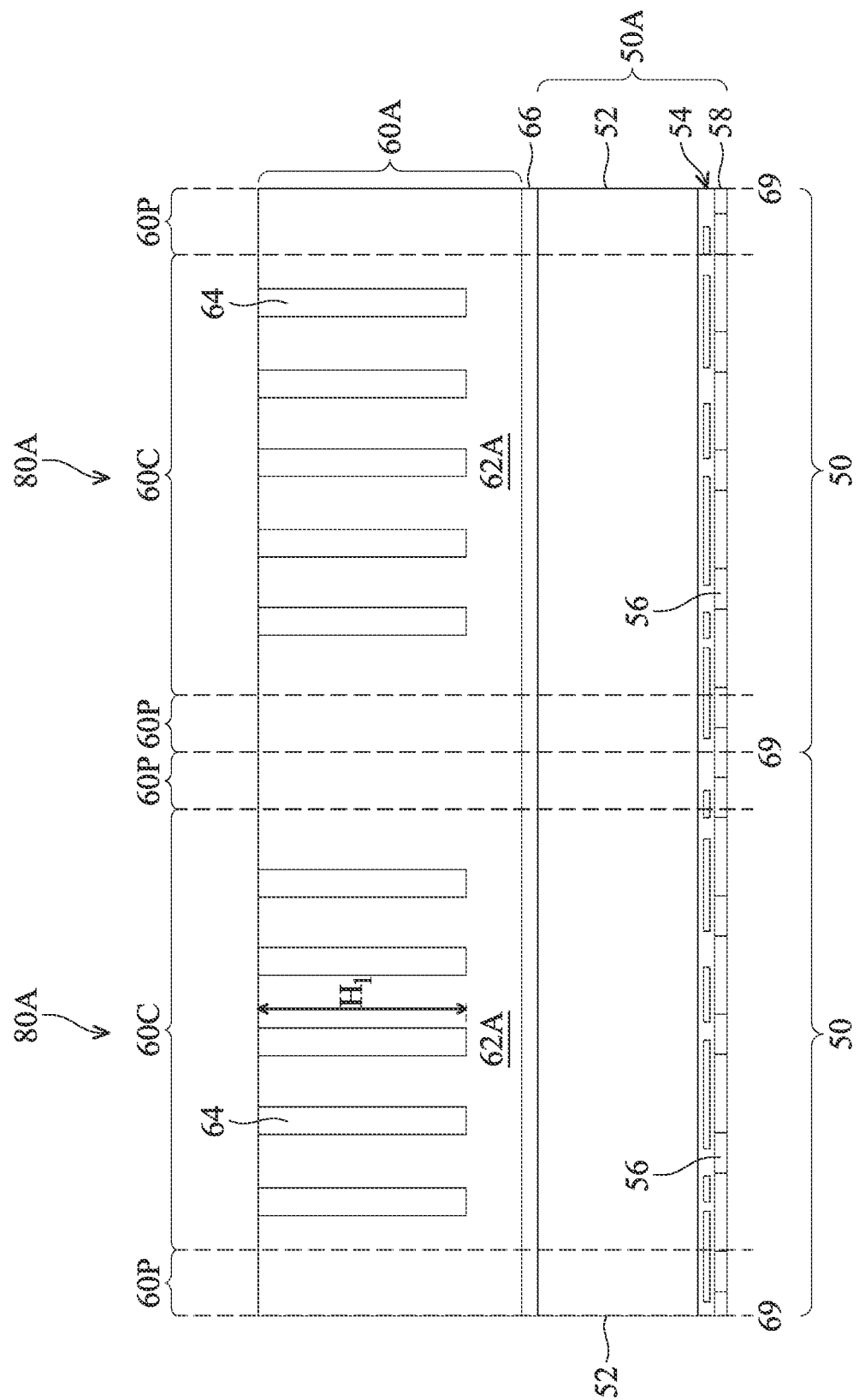

FIGS. 3-5 illustrate an exemplary flow of forming the structure described for FIGS. 2A and 2B in accordance with some embodiments. In FIG. 3, a blank wafer 60A having a plurality of trenches 68 is shown. The blank wafer 60A may include a bulk substrate 62A, which is a wafer form of the semiconductor substrate 52 as described for FIG. 1 and will be singulated to become a plurality of the bulk substrates 62 as illustrated in FIG. 2A in subsequent processing. The plurality of trenches 68 may be formed in the bulk substrate 62A. In some embodiments, the trenches 68 may have the same pattern as the strips 64, such as having the width $W_1$ and the pitch P, and may have a depth same as the height $H_1$ of the strips 64. The formation of the trenches 68 may include forming a patterned mask (not shown), such as a hard mask that includes patterns of the trenches 68, on the top surface of the bulk substrate 62A, and etching the bulk substrate 62A according to the patterns of the patterned mask. The etching process may include a dry etching such as reactive ion etching (RIE) or the like. After the trenches 68 are formed, the patterned mask may be removed by any acceptable removable process, such as a wet etching or a dry etching.

In FIG. 4, the trenches 68 are filled to form a plurality of the strips 64 in the bulk substrate 62A in accordance with some embodiments. In some embodiments, the strips 64 are formed by chemical vapor deposition (CVD), spin coating, lamination, or the like. An as-formed material of the strips 64 may fill the trenches 68 and have an excess portion (not shown) over a top surface of the bulk substrate 62A. A planarization process, such as chemical mechanical polishing (CMP) or mechanical grinding, may be performed to remove the excess portion of the material of the strips 64 over the top surface of the bulk substrate 62A, leaving the strips 64 embedded in the bulk substrate 62A and exposed from a top surface of the bulk substrate 62A. In some embodiments, the thickness of the blank wafer 60A may be adjusted by grinding the blank wafer 60A from its bottom surface.

In FIG. 5, a wafer 50A comprising a plurality of the integrated circuit dies 50 is formed or provided, and the blank wafer 60A including the strips 64 is attached to the wafer 50A. In some embodiments, the bulk substrate 62A of the blank wafer 60A is bonded to the wafer 50A by wafer-to-wafer bonding. For example, a bottom surface of the bulk substrate 62A may be attached to the inactive surface of the wafer 50A (e.g., the inactive surface of the semiconductor substrate 52). The wafer-to-wafer bonding may be performed using direct bonding or adhesion using, e.g., the bonding film 66 as discussed above. Although not illustrated in detail here, it is appreciated that the wafer-to-wafer bonding may be implemented by other suitable techniques.

FIG. 5 further illustrates singulation of the blank wafer 60A, the bonding film 66, and the wafer 50A along the scribe lines 69 to form individual bonded die structures, such as the first integrated circuit device 80A illustrated in FIG. 2A. FIG. 5 illustrates a single scribe line 69 to form two first integrated circuit device 80A for illustrative purposes, and embodiments may include any number of scribe lines to form more individual structures such as those illustrated in FIG. 2A.

Figure 6:
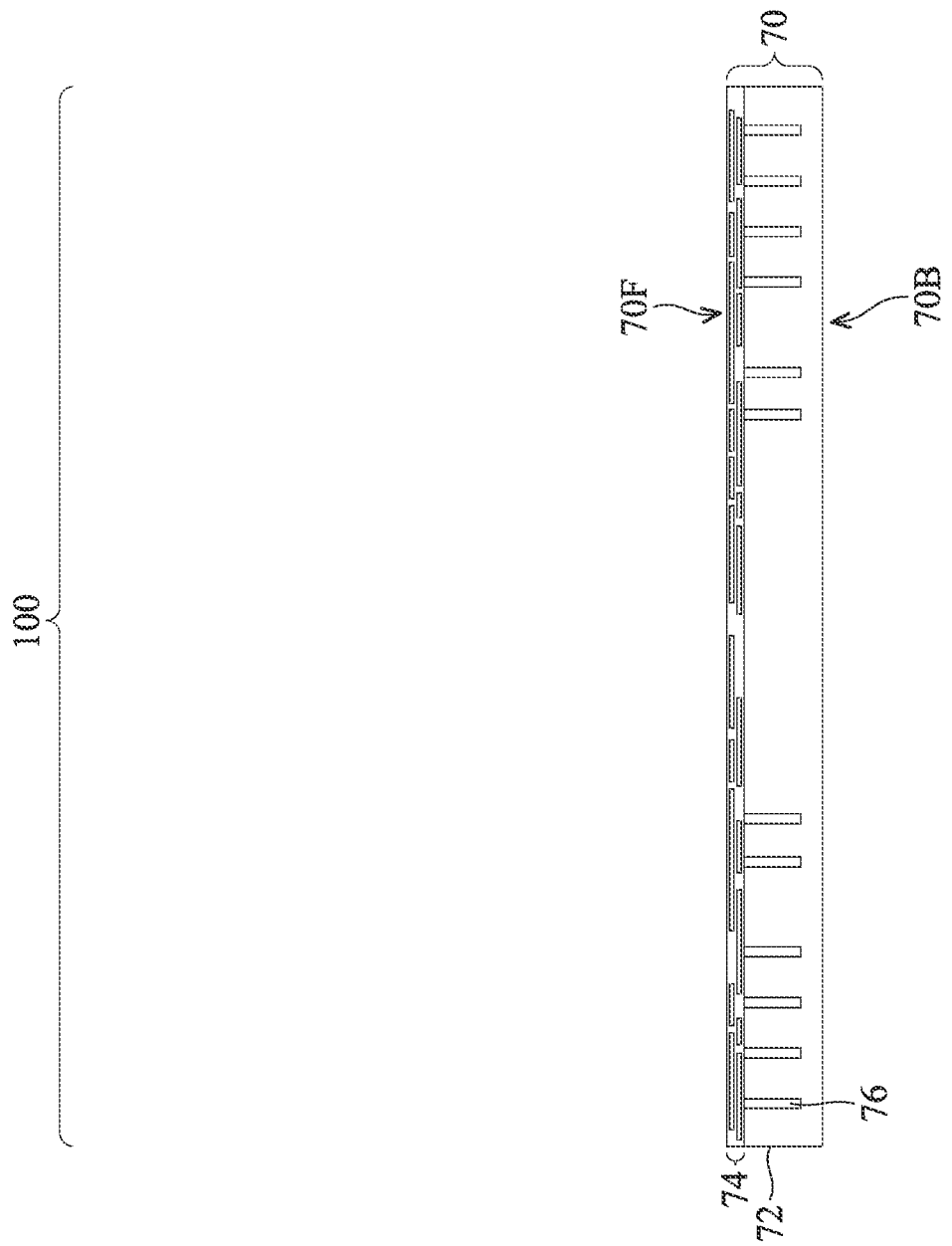
FIGS. 6-20B are cross-sectional views of intermediate stages in the manufacturing of an integrated circuit package, in accordance with some embodiments.

FIGS. 6-20 are cross-sectional views of intermediate stages in the manufacturing of an integrated circuit package 100 comprising the first integrated circuit device 80A (see FIG. 2A), in accordance with some embodiments. Referring first to FIG. 6, an interposer 70 is shown. The interposer 70 may be a wafer, and a plurality of the first integrated circuit devices 80A may be attached to the interposer 70 using chip-on-wafer (CoW) techniques and later singulated to form individual packages. It is also appreciated that the embodiments illustrated in this disclosure may also be applied to various types of 3DIC packages.

In FIG. 6, the interposer 70 is obtained or formed. In some embodiments, the interposer 70 includes a substrate 72, an interconnect structure 74, and through vias 76. The substrate 72 may be a bulk semiconductor substrate, a semiconductor-on-insulator (SOI) substrate, a multi-layered semiconductor substrate, or the like. The substrate 72 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 72 may be doped or undoped. In some embodiments, the substrate 72 does not include active devices therein, although the interposers may include passive devices formed in and/or on a front surface (e.g., 70F) of the substrate 72.

The interconnect structure 74 is over the front surface of the substrate 72, and is used to electrically connect the devices (if any) of the substrate 72 and/or the devices attached to the interposer 70. The interconnect structure 74 may include one or more dielectric layer(s) and respective metallization layer(s) in the dielectric layer(s). Acceptable dielectric materials for the dielectric layers include an oxide, a nitride, a carbide, a combination thereof, or the like. For example, the dielectric material may include silicon oxide, aluminum oxide, silicon nitride; silicon oxynitride, silicon carbide, silicon oxycarbide, silicon carbonitride, silicon oxycarbonitride, a combination thereof, or the like. Other dielectric materials may also be used, such as a polymer such as polybenzoxazole (PBO), polyimide, a benzocyclobutene (BCB) based polymer, or the like. The metallization layer(s) may include conductive vias and/or conductive lines to interconnect any devices together and/or to an external device. The metallization layer(s) may be formed of a conductive material, such as a metal, which may be copper, cobalt, aluminum, gold, combinations thereof, or the like. The interconnect structure 74 may be formed by a damascene process, such as a single damascene process, a dual damascene process, or the like.

In some embodiments, die connectors and a dielectric layer (not separately illustrated) are at the front side 70F of the interposer 70. Specifically, the interposer 70 may include die connectors and a dielectric layer that are similar to those of the integrated circuit die 50 described for FIG. 1. For example, the die connectors and the dielectric layer may be part of an upper metallization layer of the interconnect structure 74.

The through vias 76 extend into the interconnect structure 74 and/or the substrate 72. The through vias 76 are electrically connected to metallization layer(s) of the interconnect structure 74. As an example to form the through vias 76, recesses can be formed in the interconnect structure 74 and/or the substrate 72 by, for example, etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed of an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the interconnect structure 74 or the substrate 72 by, for example, a CMP. Remaining portions of the barrier layer and conductive material form the through vias 76.

Figure 7:
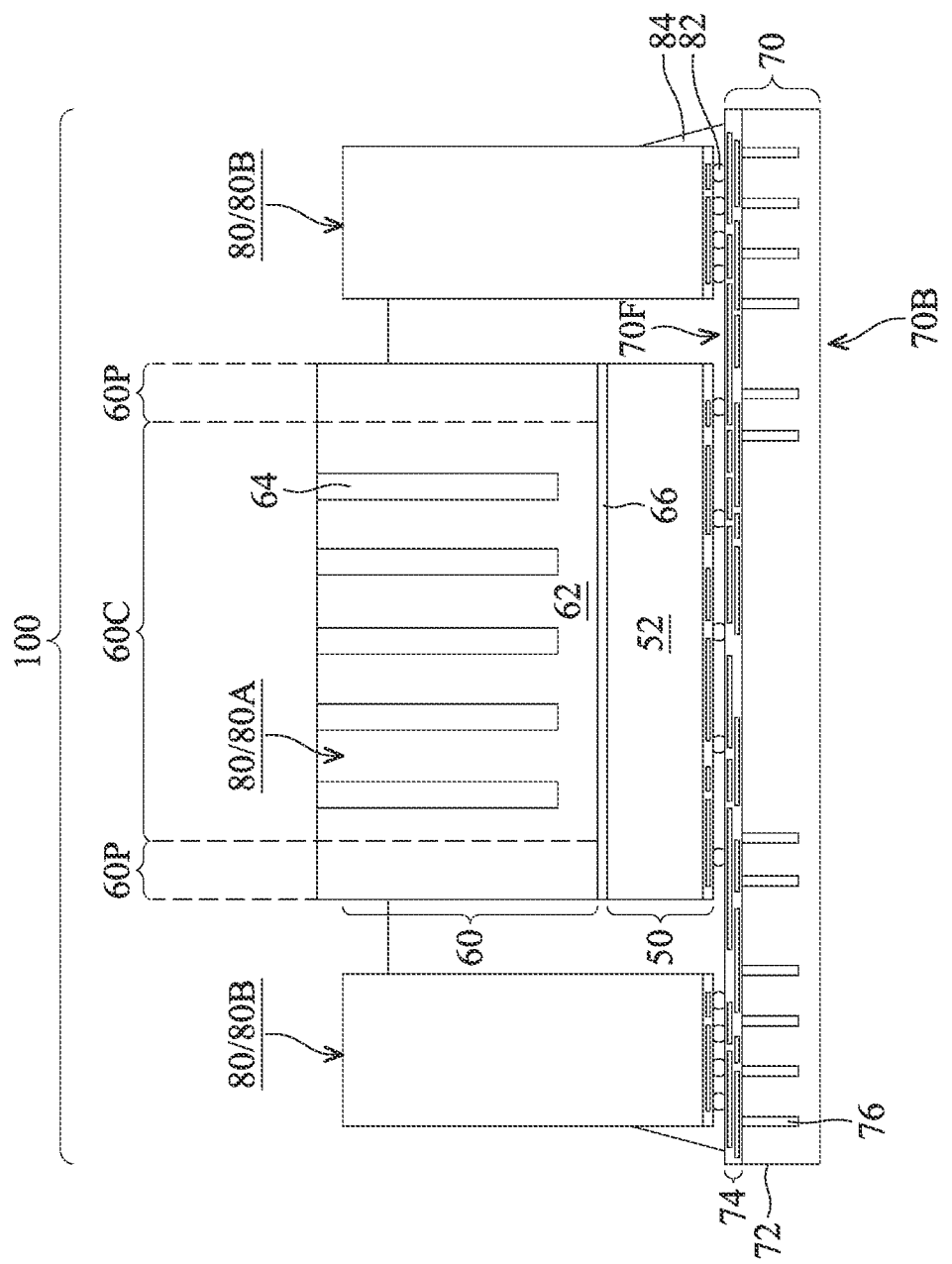

FIG. 7 illustrates one or more integrated circuit devices attached to the interposer 70 in accordance with some embodiments. In the example illustrated in FIG. 7, one integrated circuit device such as the first integrated circuit device 80A illustrated in FIGS. 2A and 2B) and two second integrated circuit devices 80B are attached to the interposer 70, wherein the second integrated circuit devices 80B and the first integrated circuit device 80A are collectively referred to as integrated circuit devices 80. The second integrated circuit devices 80B may be a memory die, a stack of memory dies, an integrated circuit die (similar to the integrated circuit die 50 described for FIG. 1), or a stack of the integrated circuit dies, or the like. The first integrated circuit device 80A may have a different function than a function of the second integrated circuit devices 80B. For example, the first integrated circuit device 80A may be a logic device, such as a central processing unit (CPU), graphics processing unit (GPU), system-on-a-chip (SoC), microcontroller, application-specific integrated circuit (ASIC), or the like. The second integrated circuit device 80B may be a memory device, such as a dynamic random-access memory (DRAM) device, static random access memory (SRAM) device, hybrid memory cube (HMC) module, a high bandwidth memory (HBM) module, or the like. The first integrated circuit device 80A and the second integrated circuit devices 80B may be formed in processes of a same technology node, or may be formed in processes of different technology nodes. For example, the first integrated circuit device 80A may be of a more advanced process node than the second integrated circuit device 80B.

In FIG. 7, the integrated circuit devices 80 are attached to the interposer 70 with conductive connectors 82, such as solder bonds. The integrated circuit devices 80 may be placed on the interconnect structure 74 using, e.g., a pick-and-place tool. The conductive connectors 82 may be formed of a reflowable conductive material, such as solder, and may further include other conductive materials such as copper, aluminum, gold, nickel, silver, palladium, tin, lead, the like, or a combination thereof. In some embodiments, the conductive connectors 82 are formed by initially forming a layer of solder through methods such as evaporation, electroplating, printing, solder transfer, ball placement, or the like. Once a layer of solder has been formed on the interposer 70, a reflow may be performed in order to shape the conductive connectors 82 into desired bump shapes. Attaching the integrated circuit devices 80 to the interposer 70 may include placing the integrated circuit devices 80 on the interposer 70 and reflowing the conductive connectors 82. The conductive connectors 82 form joints between corresponding die connectors of the interposer 70 and the integrated circuit devices 80, electrically connecting the interposer 70 to the integrated circuit devices 80.

An underfill 84 may be formed around the conductive connectors 82, and between the interposer 70 and the integrated circuit devices 80. The underfill 84 may reduce stress and protect the joints resulting from the reflowing of the conductive connectors 82. The underfill 84 may be formed of an underfill material such as an epoxy, or the like. The underfill 84 may be formed by a capillary flow process after the integrated circuit devices 80 are attached to the interposer 70, or may be formed by a suitable deposition method before the integrated circuit devices 80 are attached to the interposer 70. The underfill 84 may be applied in liquid or semi-liquid form and then subsequently cured. The underfill 84 may have various heights, depending on the distances between the first integrated circuit device 80A and the second integrated circuit devices 80B. In the embodiment shown, the underfill 84 may have a height greater than integrated circuit die 50 and in contact with sidewalls of the heat dissipation structure 60 of the first integrated circuit device 80A. In some embodiments, the underfill 84 has a top surface higher than a bottom surface of the strips 64. In some embodiments not shown in the figures, the underfill 84 has a top surface level with the top surface of the heat dissipation structure 60.

Figure 8:
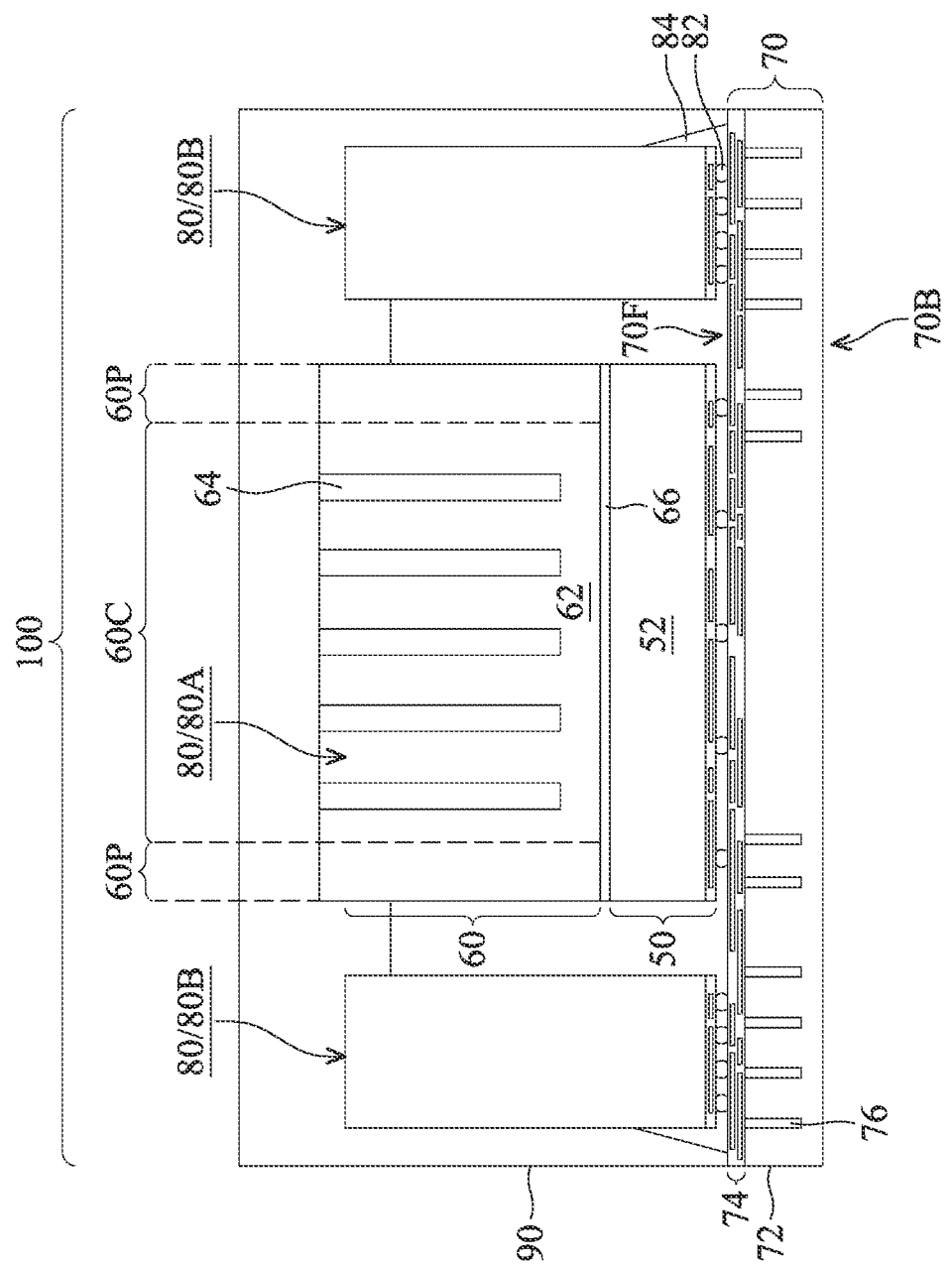

In FIG. 8, an encapsulant 90 is formed over the interposer 70 and the various components on the interposer 70. After formation, the encapsulant 90 encapsulates the integrated circuit devices 80 and the underfill 84. The encapsulant 90 may be a molding compound, which may be a polymer, a resin, an epoxy, or the like, and filler particles in the base material. The filler particles may be dielectric particles of $SiO_2$, $Al_2O_3$, or the like, and may have spherical shapes. Also, the spherical filler particles may have a plurality of different diameters. The encapsulant 90 may be applied by compression molding, transfer molding, or the like, and is formed over the interposer 70 such that the heat dissipation structure 60 and the integrated circuit devices 80 are buried or covered. The encapsulant 90 may be applied in liquid or semi-liquid form and then subsequently cured.

Figure 9:
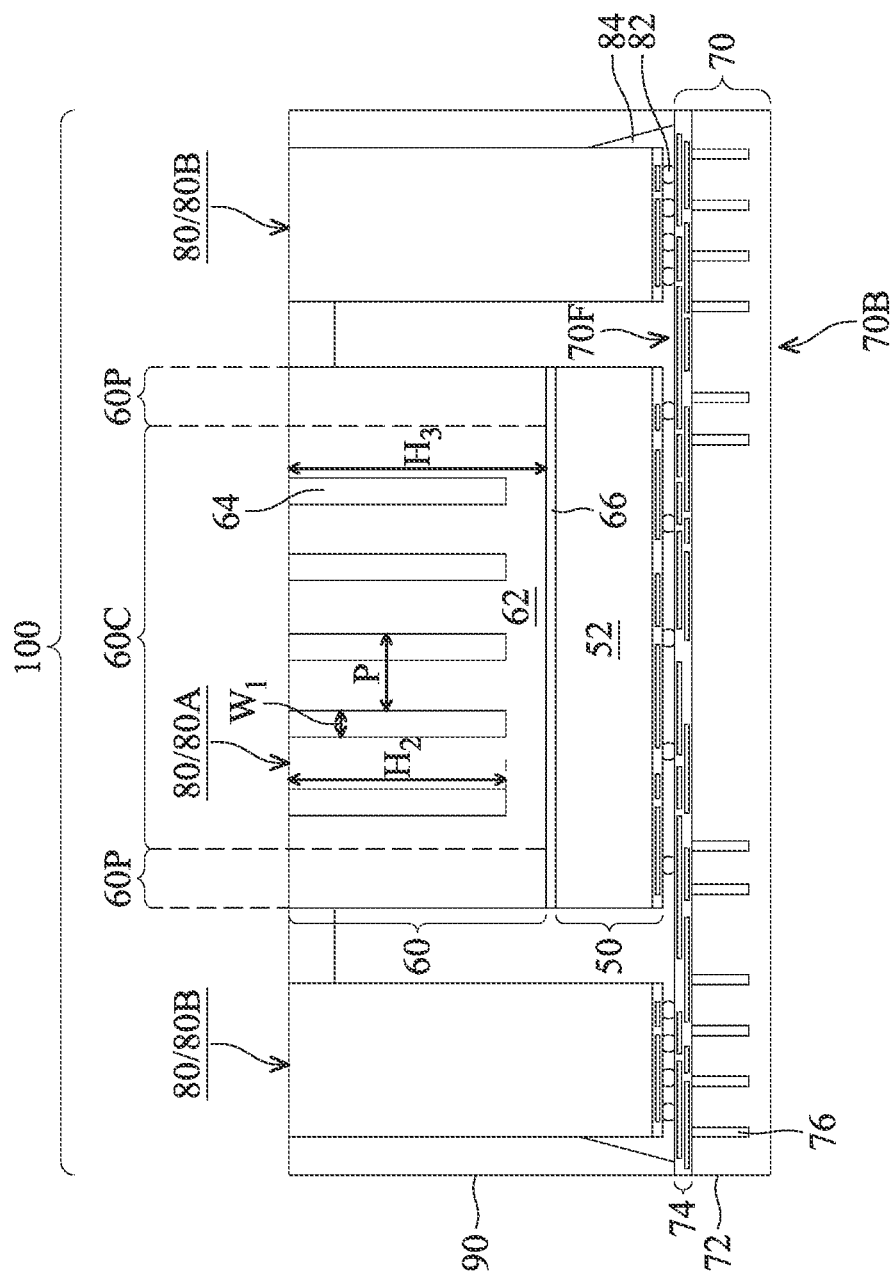

In FIG. 9, the encapsulant 90 is thinned to expose the first integrated circuit device 80A. In some embodiments, the second integrated circuit devices 80B may also be exposed, as illustrated in FIG. 9. Specifically, the thinning removes the portions of the encapsulant 90 covering the top surface of the heat dissipation structure 60 of the first integrated circuit device 80A, thereby exposing the heat dissipation structure 60. In some embodiments, the thinning also includes removing a portion of the second integrated circuit devices 80B and/or a portion of the heat dissipation structure 60 (including the strips 64) of the first integrated circuit device 80A. After the thinning process, the top surfaces of the heat dissipation structure 60 of the first integrated circuit device 80A and the encapsulant 90 are coplanar (within process variations). Additionally, top surface of one or more of the second integrated circuit devices 80B may also be coplanar (within process variations) with top surfaces of the heat dissipation structure 60 of the first integrated circuit device 80A and the encapsulant 90. In some embodiments, the strips 64 have a height $H_2$ ranging from 40 um to 590 um. After thinning, a ratio of the height $H_2$ to the width $W_1$ may be from 1 to 15. In some embodiments, a ratio of the height $H_2$ to the overall thickness $H_3$ of the heat dissipation structure 60 (after the thinning process) is in a range from 0.1 to 0.77. The thickness $H_3$ may be in a range from 400 um to 775 um. The thinning process may be a grinding process, a chemical-mechanical polish (CMP), an etch-back, combinations thereof, or the like.

Figure 10:
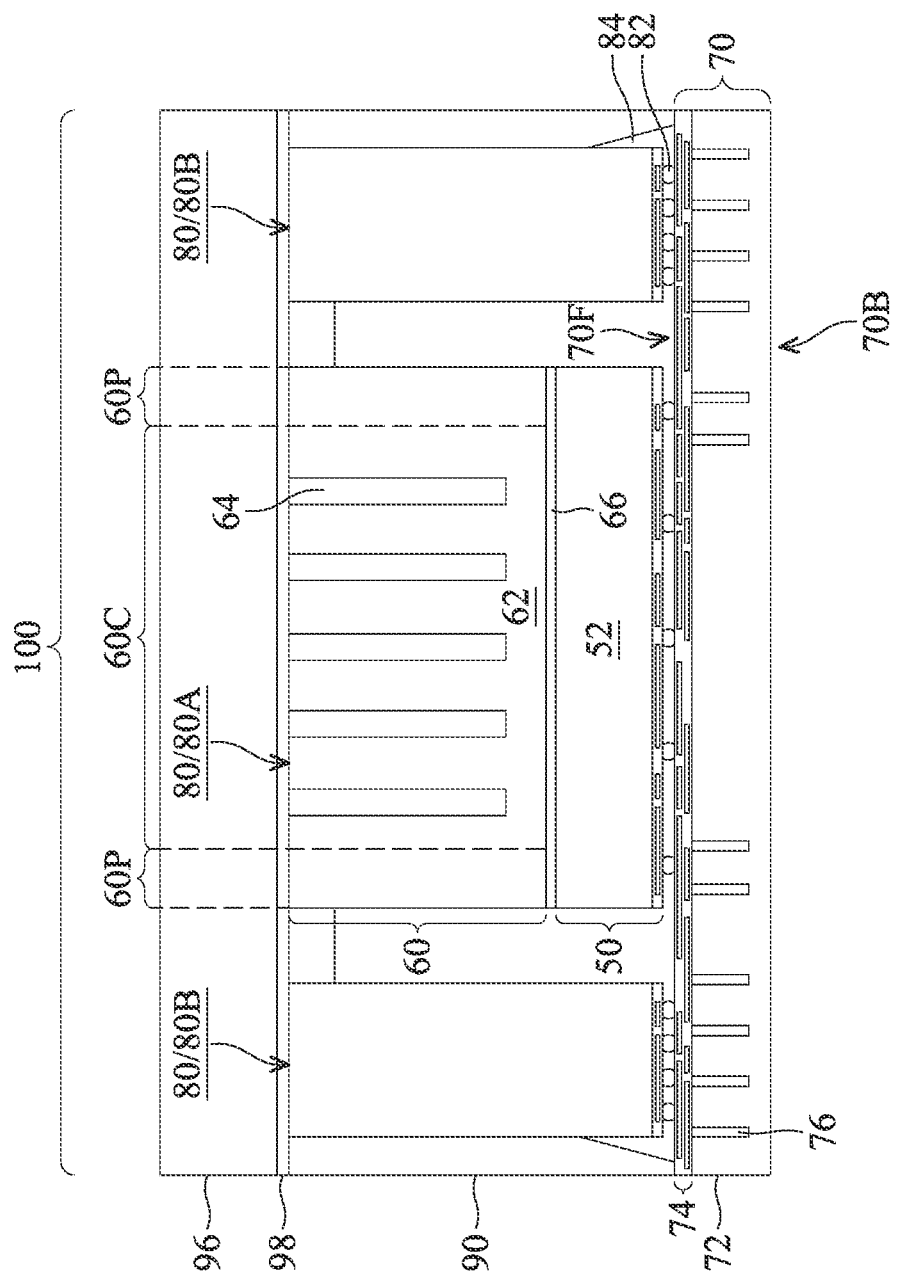

In FIG. 10, the intermediate structure may be placed on a carrier substrate 96 or other suitable support structure for subsequent processing. For example, the carrier substrate 96 may be attached to the first integrated circuit device 80A, the second integrated circuit devices 80B, and the encapsulant 90 by a release layer 98. In some embodiments, the carrier substrate 96 is a substrate such as a bulk semiconductor or a glass substrate having a wafer or panel shape or the like. The release layer 98 may be formed of a polymer-based material, which may be removed along with the carrier substrate 96 from the structure after processing. In some embodiments, the release layer 98 is an epoxy-based thermal-release material, which loses its adhesive property when heated, such as a light-to-heat-conversion (LTHC) release coating.

Figure 11:
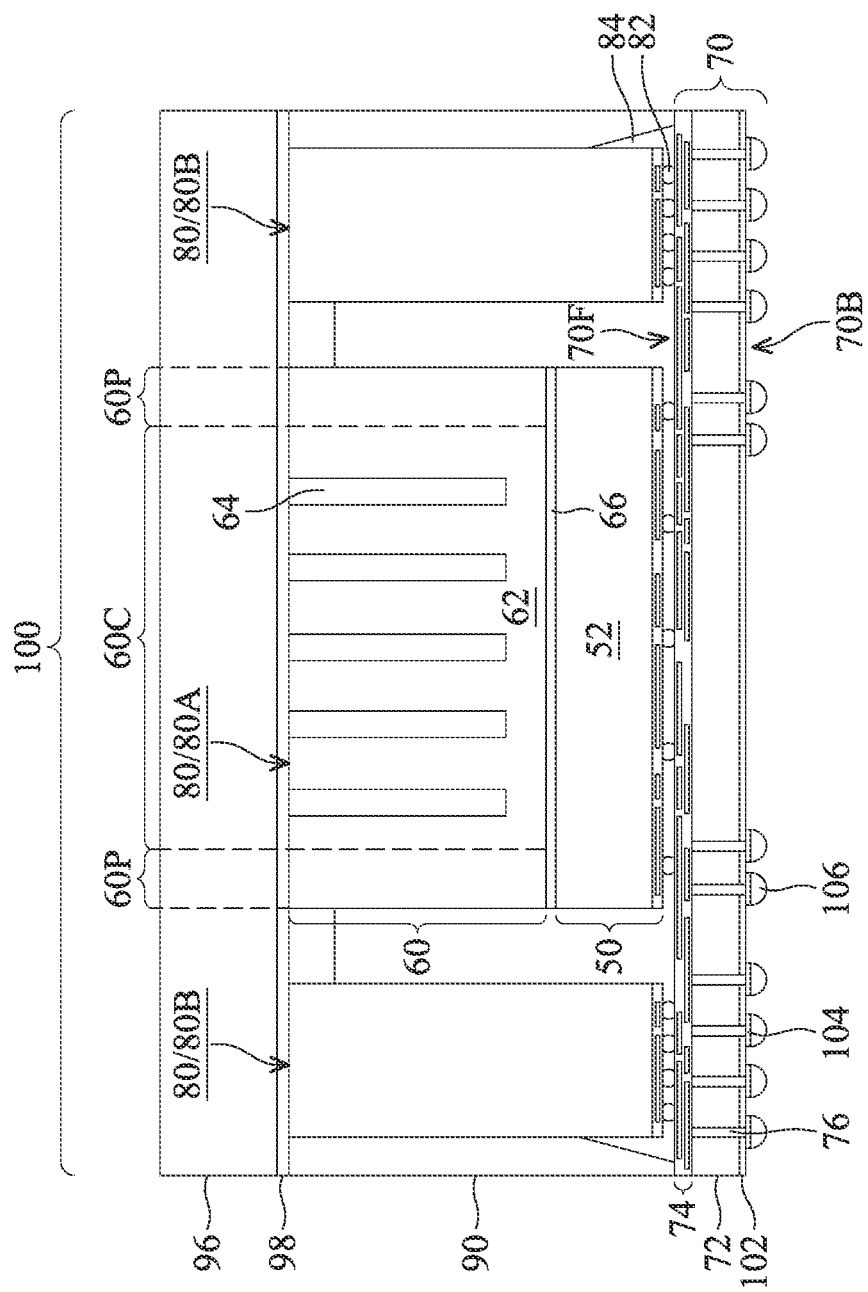

In FIG. 11, the interposer 70 is thinned to expose the through vias 76. Exposure of the through vias 76 may be accomplished by a thinning process, such as a grinding process, a chemical-mechanical polish (CMP), an etch-back, combinations thereof, or the like. In the illustrated embodiment, a recessing process is performed to recess the back surface of the substrate 72 such that the through vias 76 protrude at the back side 70B of the interposer 70. The recessing process may be, e.g., a suitable etch-back process, chemical-mechanical polish (CMP), or the like. In some embodiments, the thinning process for exposing the through vias 76 includes a CMP, and the through vias 76 protrude at the back side 70B of the interposer 70 as a result of dishing that occurs during the CMP or a separate recess etch process. An insulating layer 102 is optionally formed on the back surface of the substrate 72, surrounding the protruding portions of the through vias 76. In some embodiments, the insulating layer 102 is formed of a silicon-containing insulator, such as silicon nitride, silicon oxide, silicon oxynitride, or the like, and may be formed by a suitable deposition method such as spin coating, CVD, plasma-enhanced CVD (PECVD), high-density plasma CVD (HDP-CVD), or the like. Initially, the insulating layer 102 may bury the through vias 76. A removal process can be applied to the various layers to remove excess materials over the through vias 76. The removal process may be a planarization process such as a chemical mechanical polish (CMP), an etch-back, combinations thereof, or the like. After planarization, the exposed surfaces of the through vias 76 and the insulating layer 102 are coplanar (within process variations) and are exposed at the back side 70B of the interposer 70. In another embodiment, the insulating layer 102 is omitted, and the exposed surfaces of the substrate 72 and the through vias 76 are coplanar (within process variations).

Under bump metallurgies (UBMs) 104 may be formed on the exposed surfaces of the through vias 76 and the insulating layer 102 (or the substrate 72, when the insulating layer 102 is omitted). As an example to form the UBMs 104, a seed layer (not separately illustrated) is formed over the exposed surfaces of the through vias 76 and the insulating layer 102 (if present) or the substrate 72. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 104. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 104.

Further, conductive connectors 106 are formed on the UBMs 104. The conductive connectors 106 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 106 may be formed of a conductive material that is reflowable, such as solder, copper, aluminum, gold, nickel, silver, palladium, tin, the like, or a combination thereof. In some embodiments, the conductive connectors 106 are formed by initially forming a layer of solder through evaporation, electroplating, printing, solder transfer, ball placement, or the like. Once a layer of solder has been formed on the structure, a reflow may be performed in order to shape the material into desired bump shapes. In some embodiments, the conductive connectors 106 comprise metal pillars (such as copper pillars) formed by sputtering, printing, electroplating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 12:
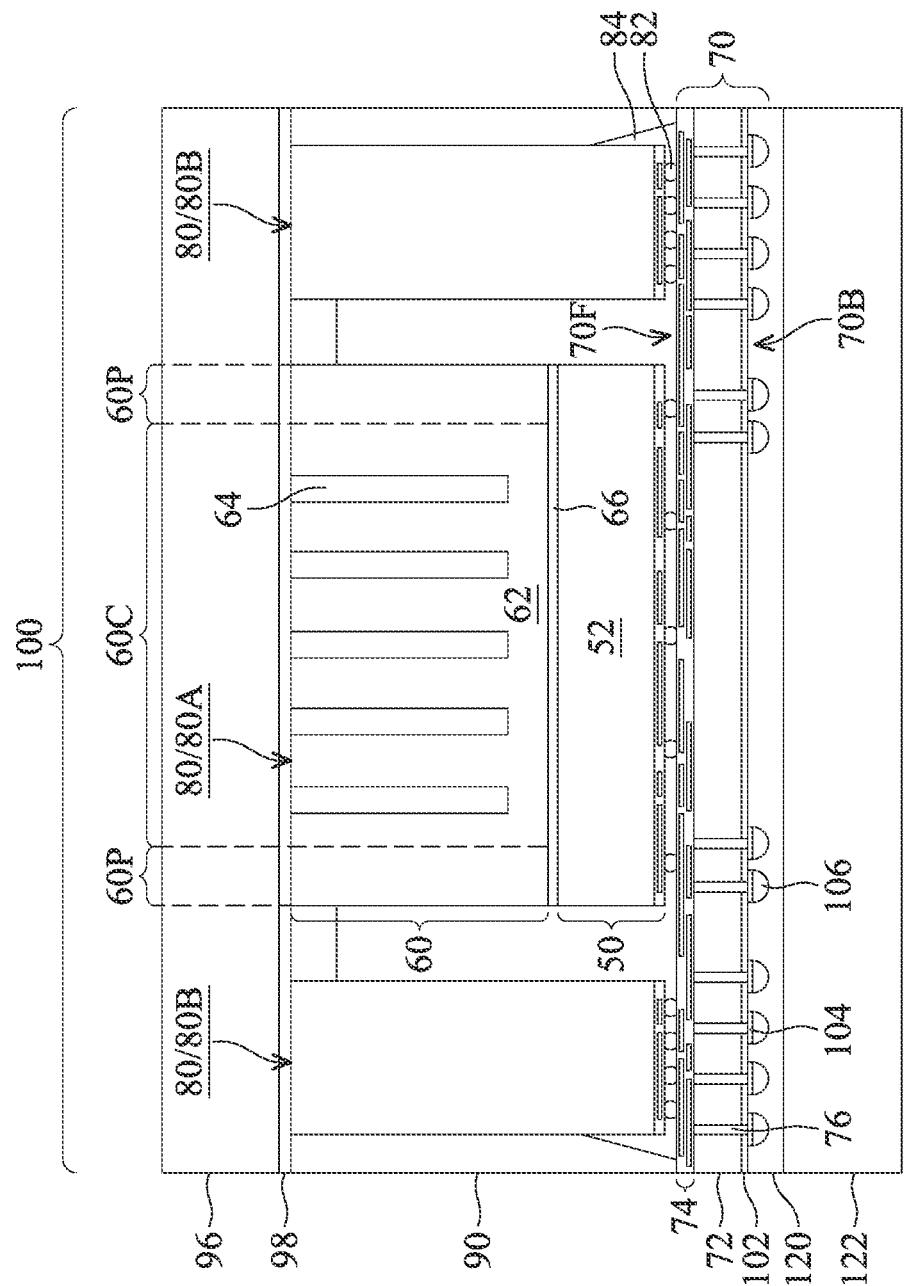

In FIG. 12, the intermediate structure is placed on a carrier substrate 120 or other suitable support structure for subsequent processing. For example, the carrier substrate 120 may be attached to the conductive connectors 106 and a back side 70B of the interposer 70 by a release layer 122. For example, the release layer 122 may have a thickness greater than the conductive connectors 106 to avoid the conductive connectors 106 from touching the carrier substrate 120, which may reduce damage to the conductive connectors 106. The release layer 122 may have a similar material as the release layer 98, such as a thermal-release material, which may lose its adhesive property when heated, such as LTHC release coating. In some embodiments, the carrier substrate 120 is a bulk semiconductor substrate or a glass substrate having a wafer or panel shape or the like.

Figure 13:
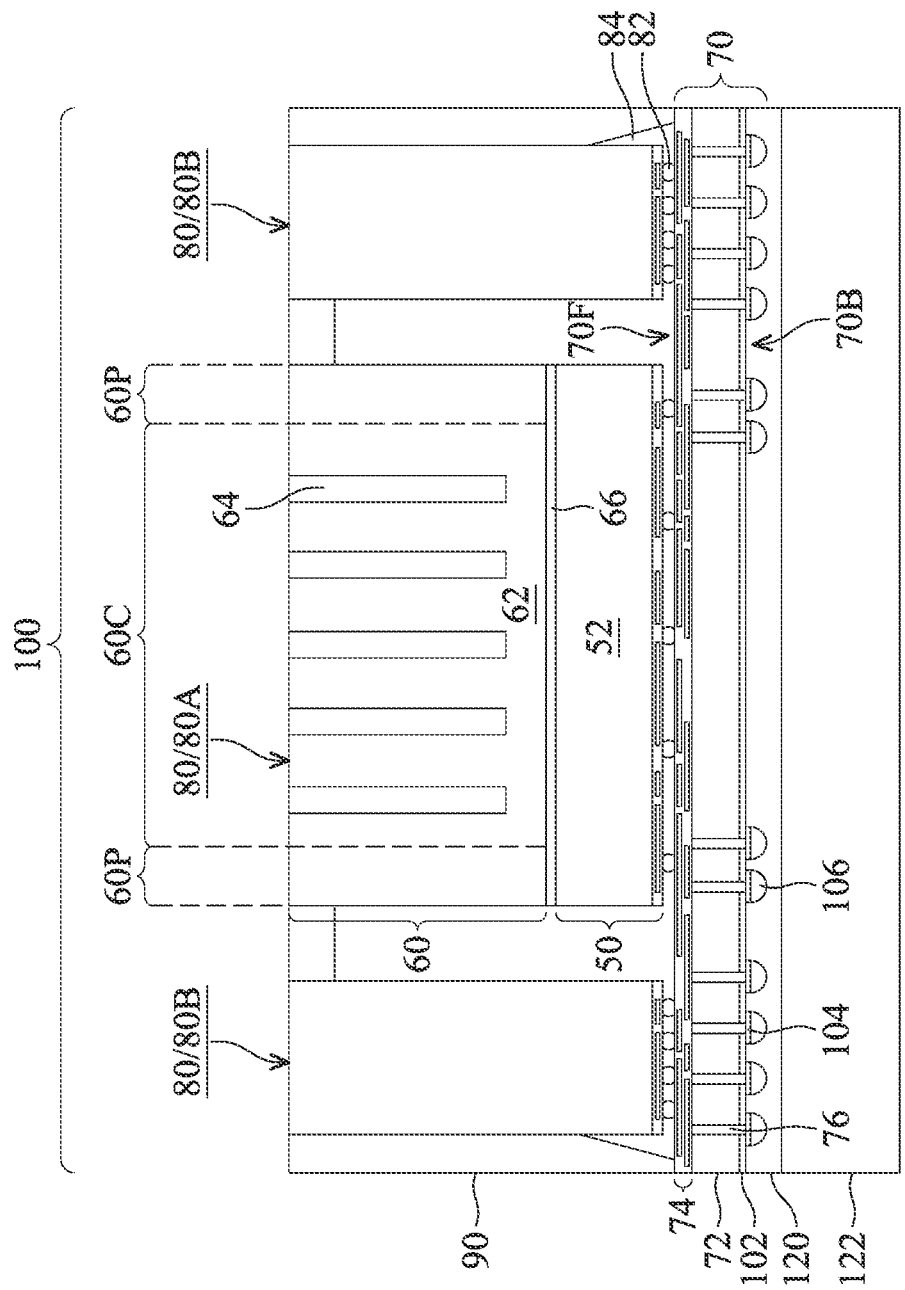

In FIG. 13, a carrier debonding process is performed to detach (debond) the carrier substrate 96 (see FIG. 12) from the first integrated circuit device 80A, the second integrated circuit devices 80B, and the encapsulant 90, thereby exposing the strips 64 embedded in the heat dissipation structure 60. The debonding includes projecting a light such as a laser light or an ultraviolet (UV) light from a top side of the carrier substrate 96 for heating the release layer 98 locally. Accordingly, the release layer 98 may be decomposed under the locally distributed heat of the light, and the carrier substrate 96 can be removed, while the release layer 122 on the back side 70B of the interposer 70 may not be affected.

Figure 14:
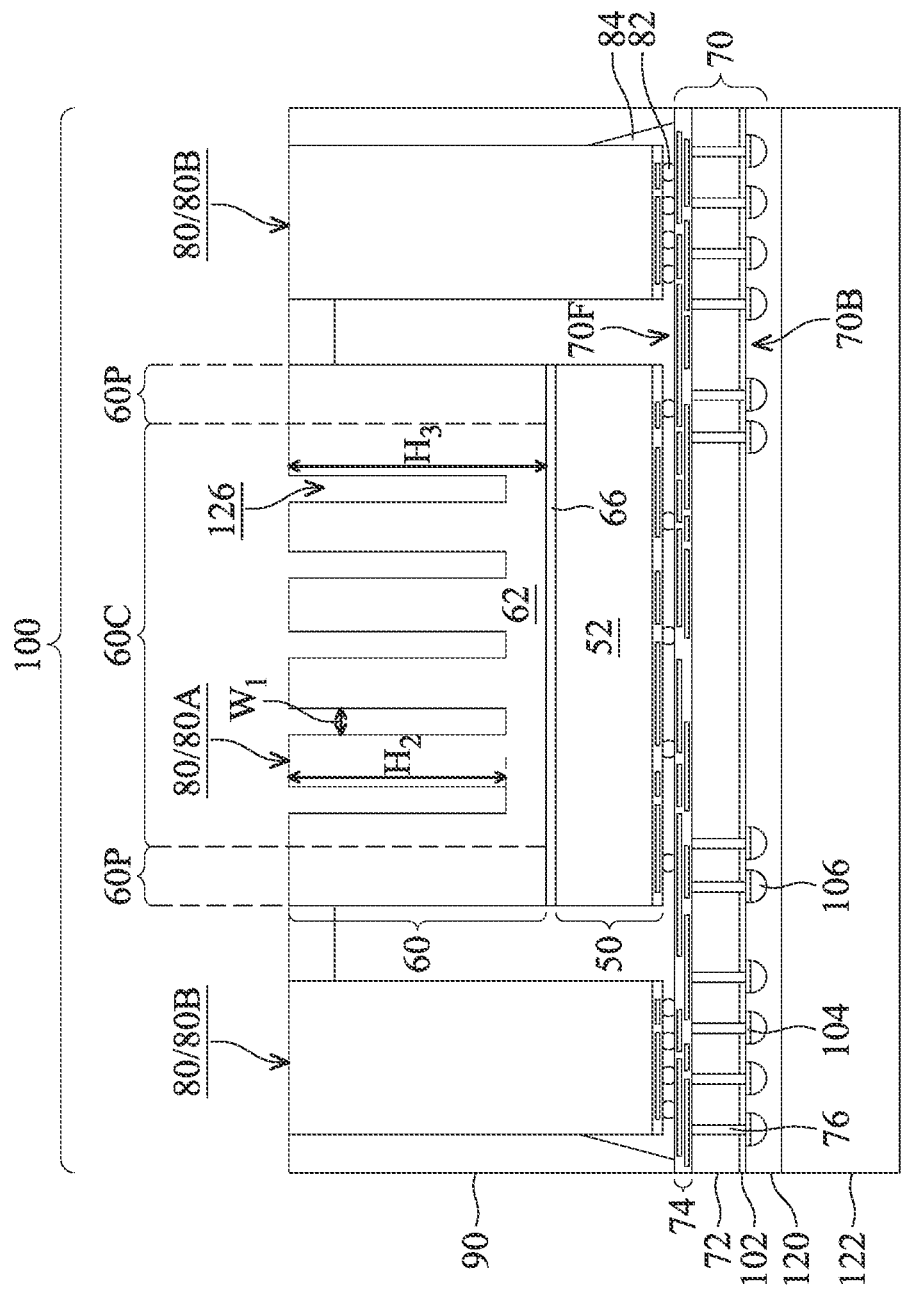

In FIG. 14, the strips 64 embedded in the heat dissipation structure 60 are removed, thereby forming micro-channels 126 in the heat dissipation structure 60 of the first integrated circuit device 80A in accordance with some embodiments. In some embodiments, the micro-channels 126 have a shape corresponding to those of the strips 64, such as having the width $W_1$, the pitch P, and the height $H_2$. In some embodiments, the strips 64 are removed by wet etching, with a suitable acidic or basic etching solution. As will be discussed in greater detail below, the micro-channels 126 may allow cooling fluid (such as water, fluorocarbons, or other suitable coolants) to flow through, and heat generated by the first integrated circuit device 80A and/or other devices in the integrated circuit package 100 can be effectively conducted away by the cooling fluid.

Figure 15:
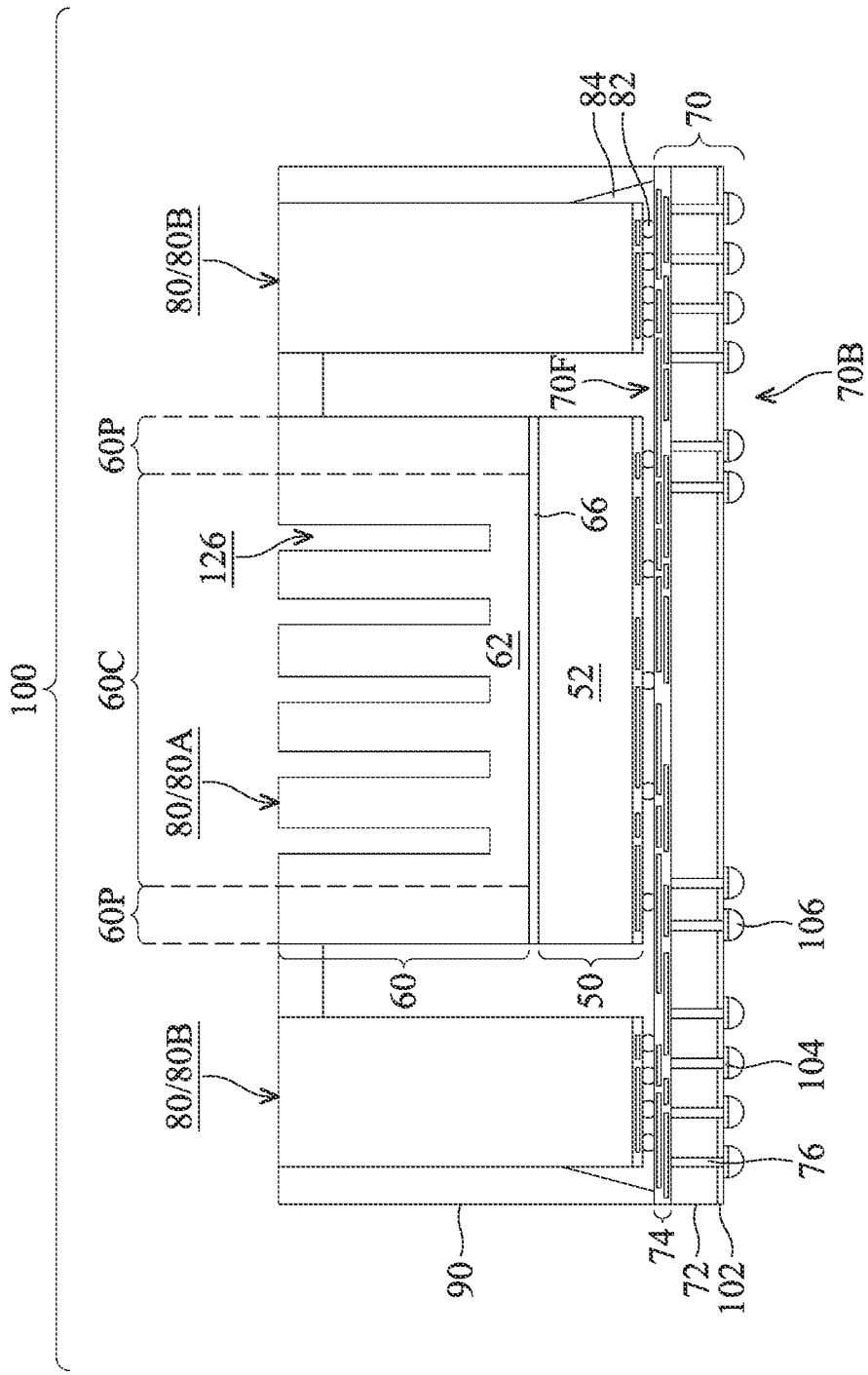

In FIG. 15, a carrier debonding is performed to detach (debond) the carrier substrate 120 (see FIG. 14) from the back side 70B of the interposer 70. The debonding includes projecting a light such as a laser light or a UV light for heating the release layer 122. Accordingly, the release layer 122 may be decomposed under the heat of the light, and the carrier substrate 120 can be removed.

The processes discussed above may be performed at the wafer level, wherein the interposer 70 is wafer sized, and a singulation process is performed. For example, the intermediate structure may be placed on a tape (not shown), and a singulation process is performed by cutting along scribe line regions to form the structure as illustrated in FIG. 15. The singulation process may include sawing, dicing, or the like. For example, the singulation process can include sawing the insulating layer 102, the encapsulant 90, the interconnect structure 74, and the substrate 72. The singulation process singulates the wafer-sized interposer 70 into separate packages. As a result of the singulation process, the outer sidewalls of the interposer 70 and the encapsulant 90 are laterally coterminous (within process variations).

Figure 16:
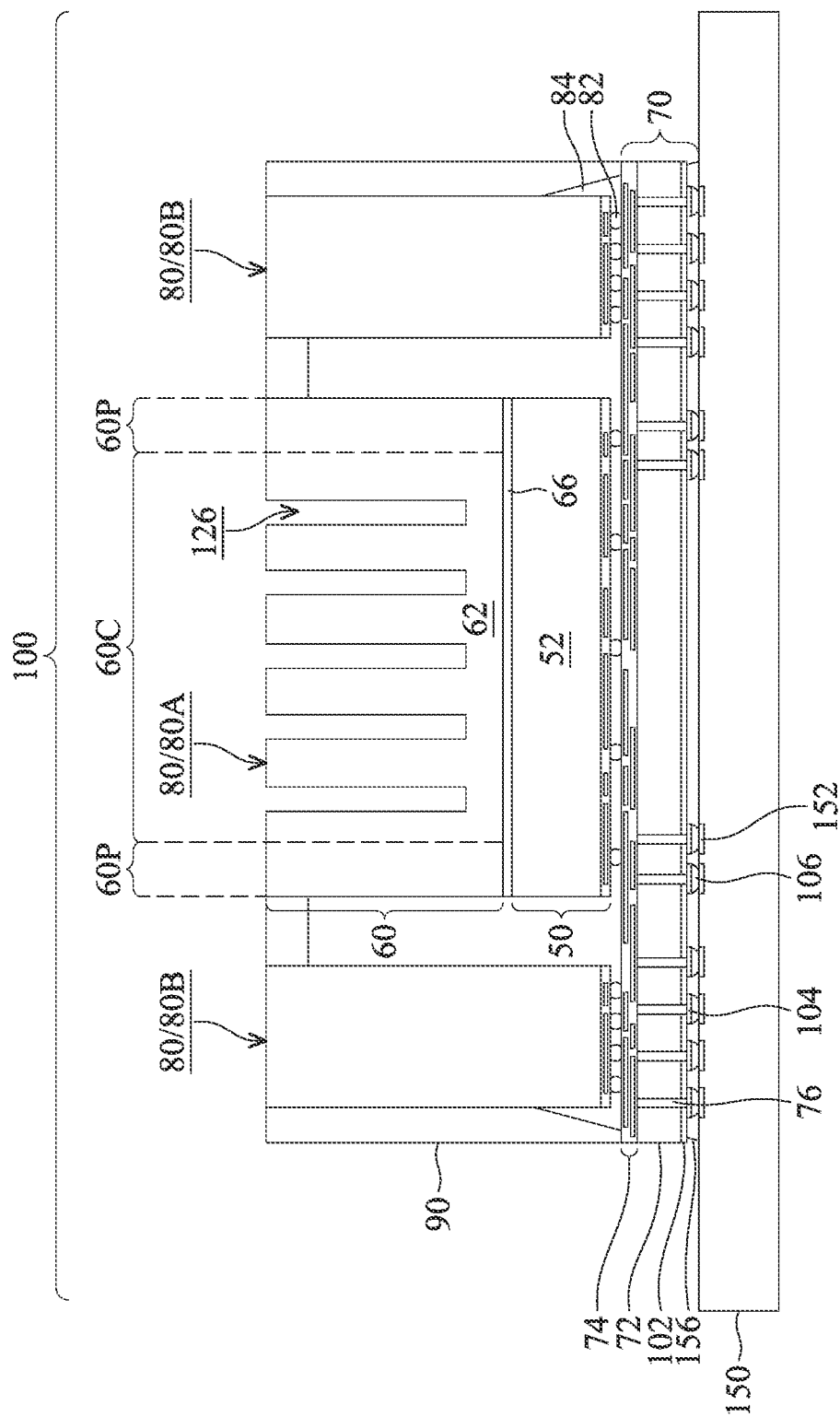
Figure 17:
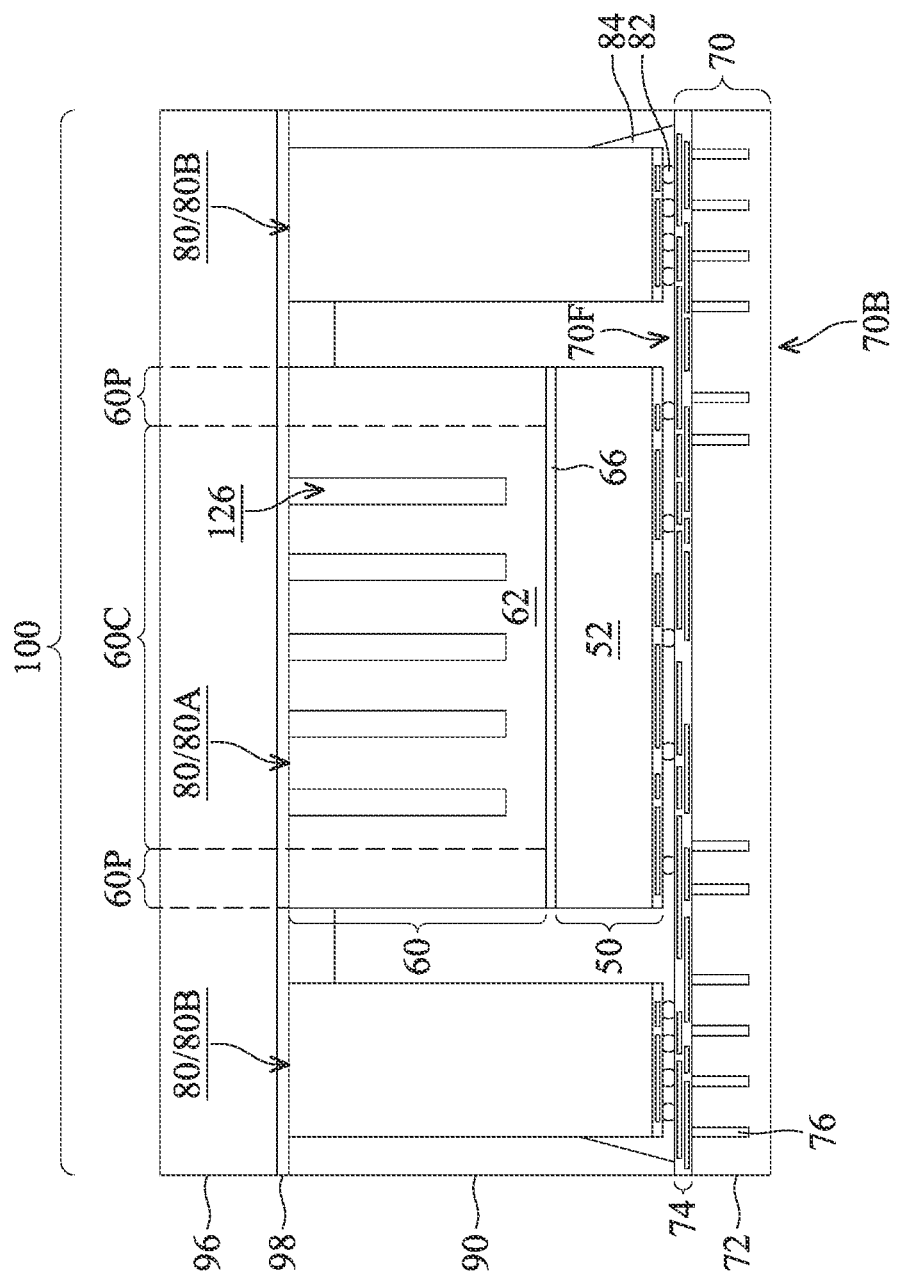

In FIG. 16, one or more of the singulated packages obtained in FIG. 15 is attached to a substrate 150 using the conductive connectors 106. The substrate 150 may be an interposer, a core substrate, a coreless substrate, a printed circuit board (PCB), a package substrate, or the like. The substrate 150 may include active and/or passive devices (not separately illustrated). Devices such as transistors, capacitors, resistors, combinations thereof, and the like may be used to generate the structural and functional requirements of the design for the system. The devices may be formed using any suitable methods.

The substrate 150 may also include metallization layers and vias (not separately illustrated) and bond pads 152 over the metallization layers and vias. The conductive connectors 106 may comprise solder reflowed to attach the UBMs 104 to the bond pads 152. The conductive connectors 106 electrically connect the metallization layers of the interconnect structure 74 of the interposer 70 to the substrate 150, including metallization layers in the substrate 150. Thus, the substrate 150 is electrically connected to the integrated circuit devices 80. In some embodiments, passive devices (e.g., surface mount devices (SMDs), not separately illustrated) may be attached to the back side 70B of the interposer 70 (e.g., bonded to the UBMs 104) prior to mounting on the substrate 150. In such embodiments, the passive devices may be bonded to a same surface of the substrate 150 as the conductive connectors 106.

In some embodiments, an underfill 156 is formed between the interposer 70 and the substrate 150, surrounding the conductive connectors 106 and the UBMs 104. The underfill 156 may be formed by a capillary flow process after substrate 150 is attached or may be formed by a suitable deposition method before the substrate 150 is attached. The underfill 156 may be a continuous material extending from the substrate 150 to the interposer 70 (e.g., the insulating layer 102).

The above manufacturing processes are illustrated for illustration purposes, and not limited thereto. Suitable structural and/or process variations may also be implemented in accordance with some embodiments. For example, the strips 64 may be removed before the thinning of the interposer 70 (see FIG. 10). In some embodiments, after thinning the encapsulant 90 to expose the strips 64, as illustrated in FIG. 9, the removal of the strips 64 may be performed to form the micro-channels 126, such as by the removing processes as illustrated in FIG. 14. Next, referring to FIG. 17, the carrier substrate 96 may be attached to the encapsulant 90 and the heat dissipation structure 60 and seal the micro-channels 126 through the release layer 98. Then, processes similar to those as illustrated in FIGS. 11 to 16 may be performed, except that the processes of those as illustrated in FIGS. 12 and 14 may be omitted because the strips 64 are already removed. As such, a structure similar to the structure as illustrated in FIG. 16 may be acquired. Some residual of the release layer 98 may fall into the micro-channels 126, and they may be removed by suitable cleaning processes at any manufacturing stages or by a cooling fluid that flows through the micro-channels 126.

Figure 18:
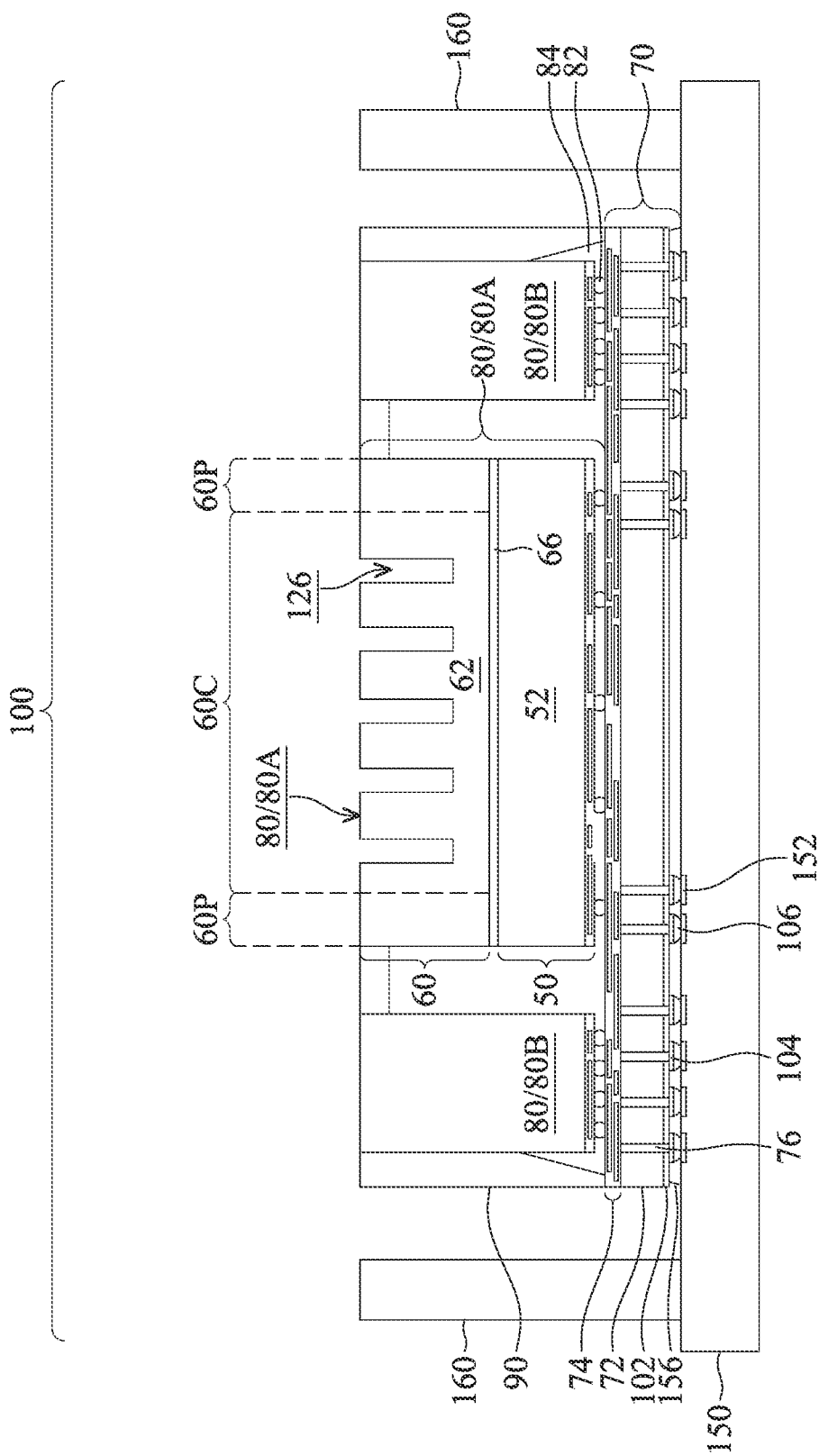

In FIG. 18, a ring structure 160 is attached to the substrate 150, in accordance with some embodiments. The ring structure 160 may laterally surround the integrated circuit devices 80 and the encapsulant 90. The ring structure 160 may be attached to the substrate 150 using an adhesive or a screw. The ring structure 160 may be a metal or metal alloy, such as aluminum, copper, nickel, cobalt, silver, titanium, iron, an alloy thereof, or a combination thereof. Alternatively, the ring structure may include silicon carbide, aluminum nitride, graphite, a combination thereof, or the like. The ring structure 160 may provide a mechanical force to reduce the warpage of the integrated circuit package 100 and also provide a path for dissipating the heat generated from the integrated circuit package 100 away.

Figure 19:
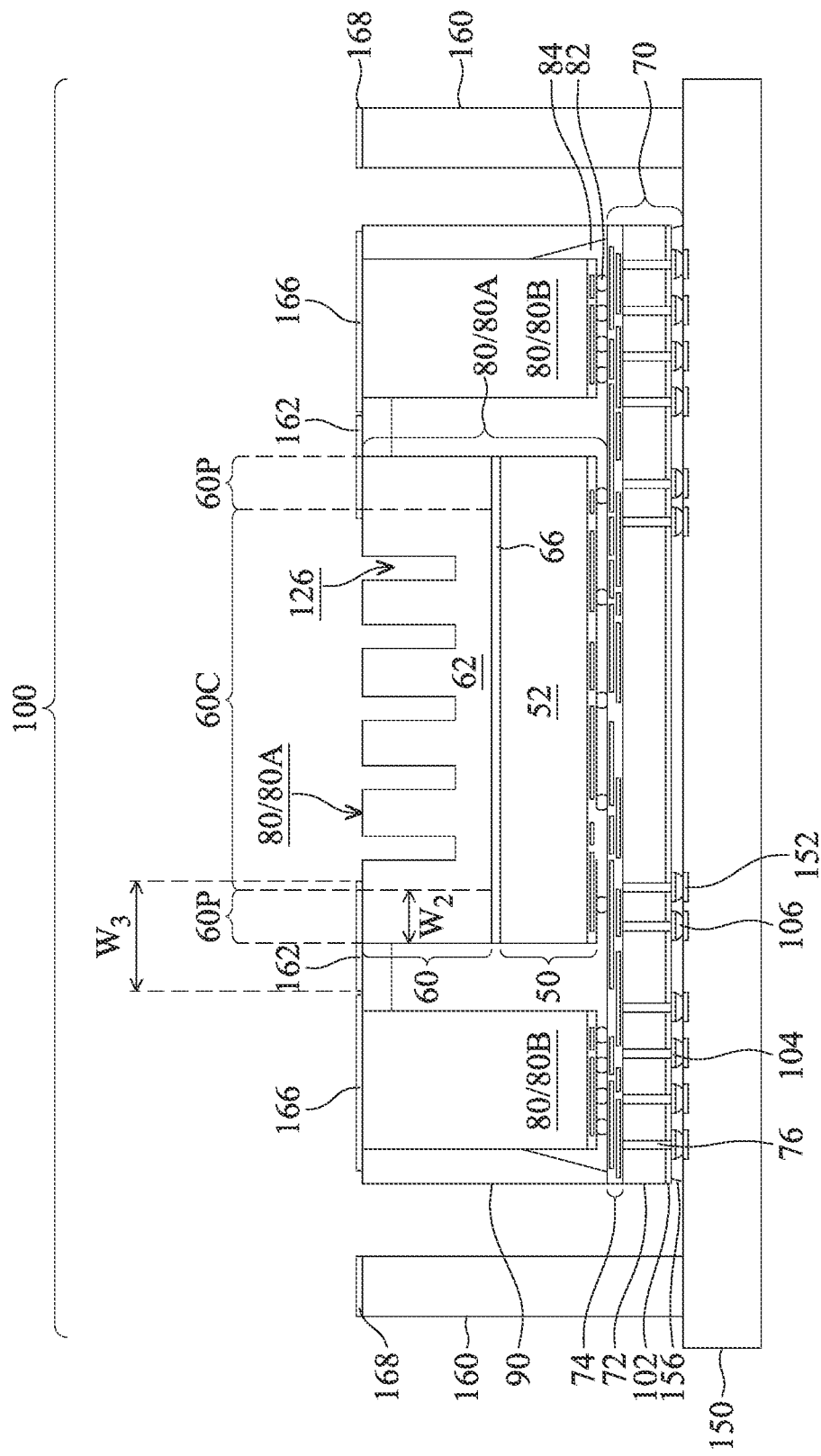

In FIG. 19, a sealant 162 is disposed over the heat dissipation structure 60, and an adhesive 166 is disposed over the second integrated circuit devices 80B, in accordance with some embodiments. For example, the sealant 162 may be disposed in the peripheral area 60P of the heat dissipation structure 60 and may extend over a portion of the encapsulant 90 between the first integrated circuit device 80A and the second integrated circuit device 80B. In some embodiments, the sealant 162 also extends into the central area of the heat dissipation structure 60, though the sealant 162 may be offset from the micro-channels 126 in a plan view. The sealant 162 may have sealing properties. For example, the sealant 162 may include silicone, epoxy, polytetrafluoroethylene (PTFE), polysulfide, polyurethane, suitable resins or rubbers, other suitable polymers, combinations thereof, or the like. In some embodiments, the sealant 162 has a width $W_3$, ranging from 0.5 mm to 2 mm. With the formation of the sealant 162 which has a sufficient width $W_3$, the leakage of the cooling fluid from the sealant 162, the interface of the sealant 162 and the heat dissipation structure 60, or the interface of the sealant 162 and the encapsulant 90 may be reduced or prevented.

The adhesive 166 is disposed over the second integrated circuit device 80B in accordance with some embodiments. The adhesive 166 may cover (e.g., in physical contact with) the entire top surface of the second integrated circuit device 80B) and may extend over the encapsulant 90. In some embodiments, the adhesive 166 further extends over a sidewall of the encapsulant 90. FIG. 19 shows the adhesive 166 being separated from the sealant 162, though the adhesive 166 may be in contact with the sealant 162 in some embodiments. The adhesive 166 may have better adhesive and thermal conducting properties than the sealant 162, though the sealant 162 may have better sealing properties than the adhesive 166. As such, the lid structure 200 (see FIG. 20A) may be attached to the intermediate structure as illustrated in FIG. 19 through the adhesive 166 and may effectively dissipate heat conducted from the second integrated circuit devices 80B and the adhesive 166. In some embodiments, the adhesive 166 is a thermal interface material, such as a thermal conducting polymeric material (e.g., a polymer having a thermal conductivity of over 3 watts per meter kelvin (W/m·K)), solder paste, indium solder paste, or the like. In some embodiments, the adhesive 166 may have a thickness similar to the thickness of the sealant 162.

In some embodiments, an adhesive 168 is disposed over the ring structure 160. The adhesive 168 may have a material similar to the adhesive 166. For example, the adhesive 168 may be the thermal interface material, such as a thermal conducting polymeric material (e.g., a polymer having a thermal conductivity of over 3 watts per meter kelvin (W/m·K)), solder paste, indium solder paste, or the like. The adhesive 168 may have a thickness different from the thickness of the adhesive 166. For example, the adhesive 168 may have a smaller thickness than the adhesive 166 when the ring structure 160 has a height greater than the height of the encapsulant 90 or may have a thickness greater than the adhesive 166 when the ring structure 160 has a height smaller than the height of the encapsulant 90. In some embodiments, the adhesive 168 may have a thickness similar to the thickness of the adhesive 166.

Figure 20A:
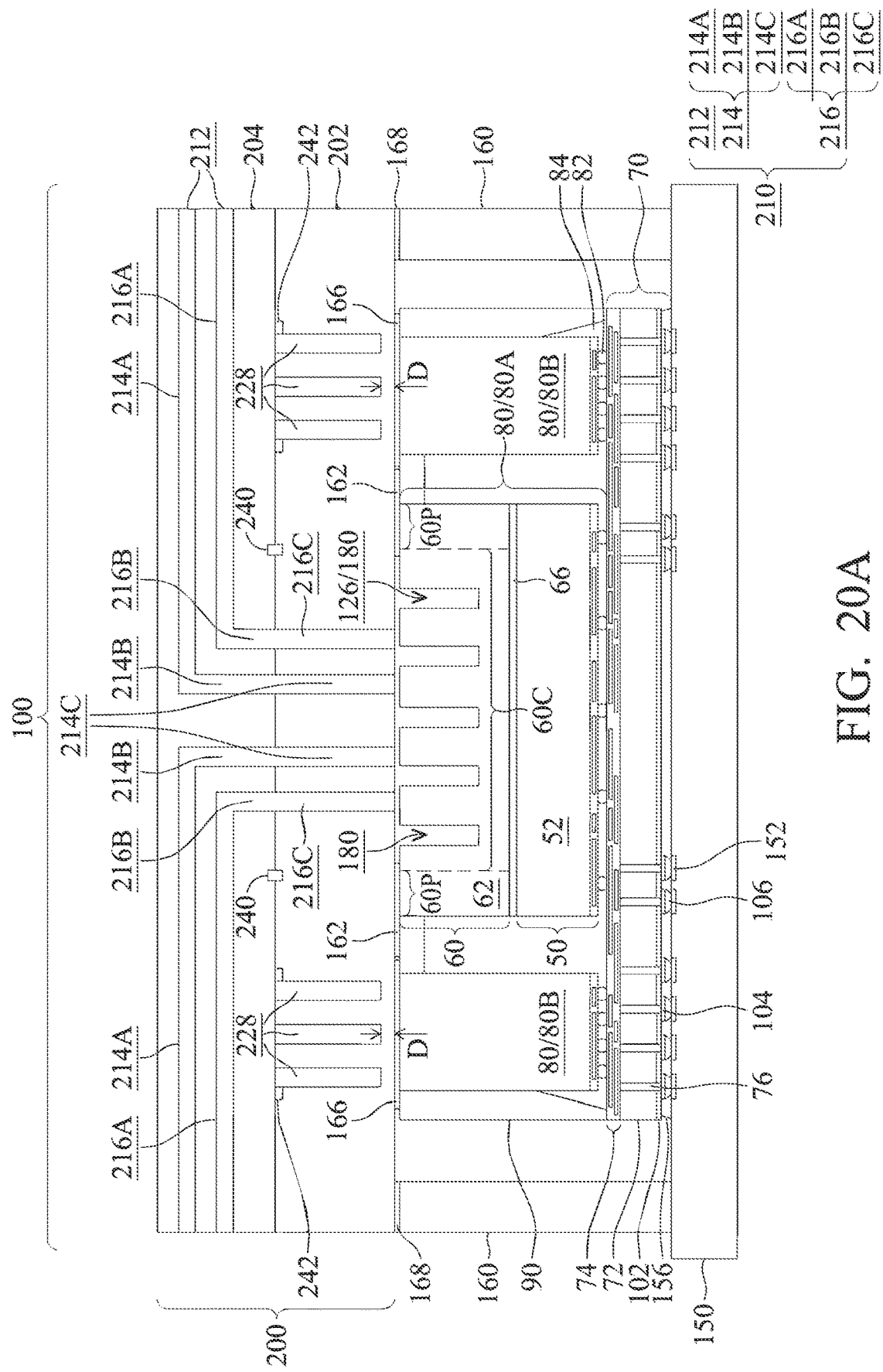
Figure 20B:
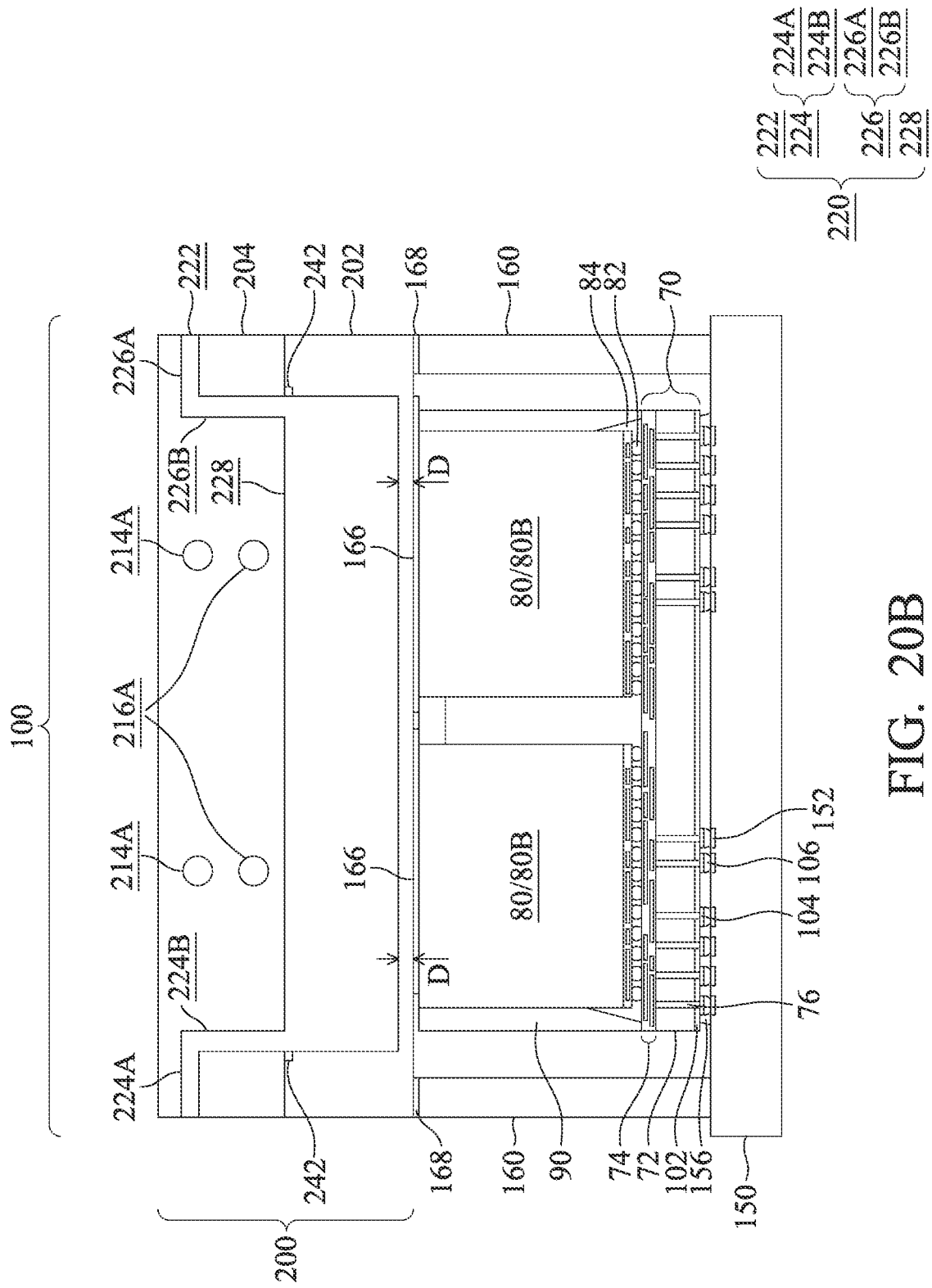
Figure 21:
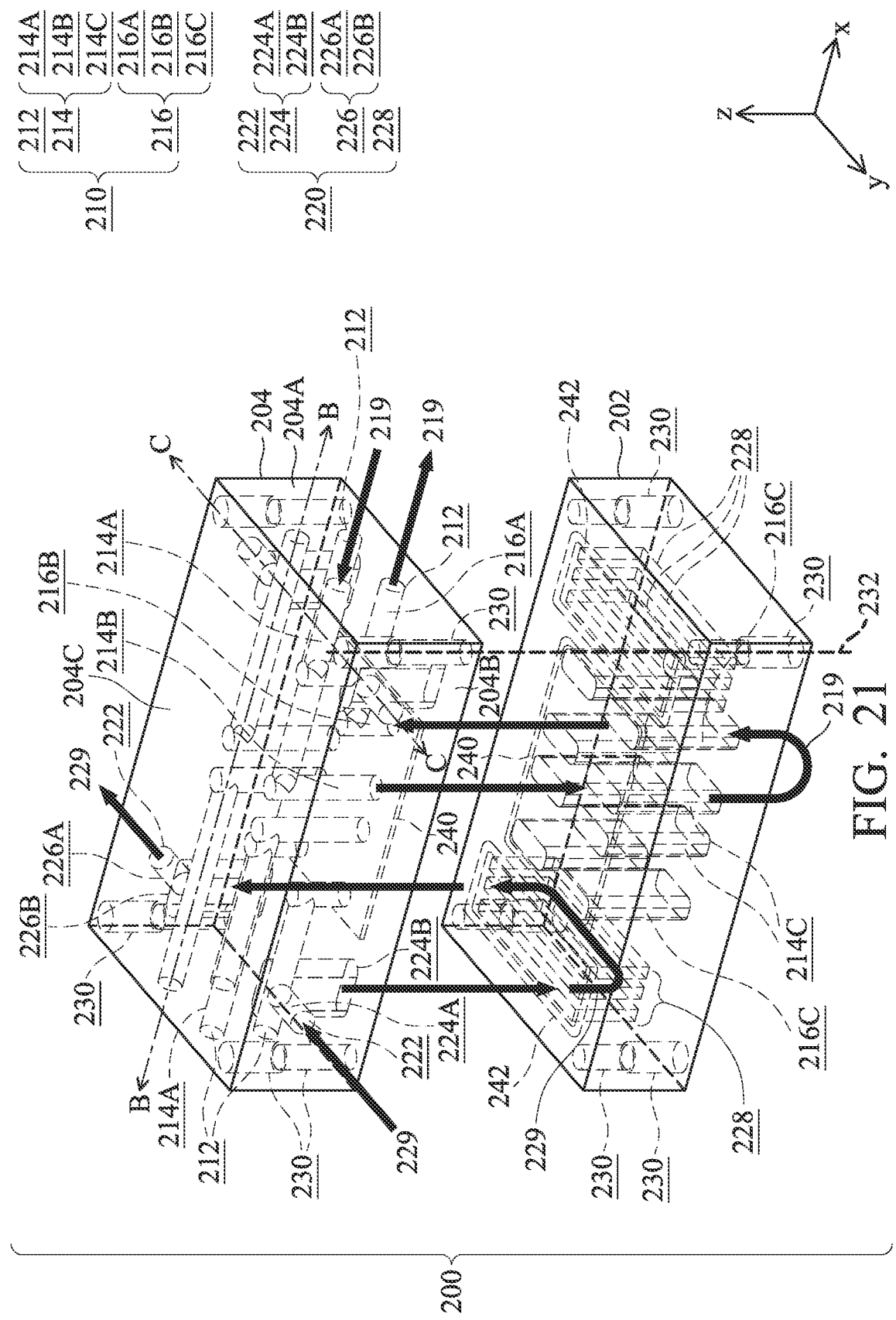
FIG. 21 is a three-dimensional view of a lid structure, in accordance with some embodiments.

Referring to FIGS. 20A, 20B, and 21, a lid structure 200 is attached to the integrated circuit devices 80 and the ring structure 160 through the sealant 162, the adhesive 166, and the adhesive 168, thereby forming a cavity 180, in accordance with some embodiments. FIG. 21 illustrates a three-dimensional view of the lid structure 200, wherein FIG. 20A is a cross-sectional view along the section B-B as illustrated in FIG. 21, and FIG. 20B is a cross-sectional view along the section C-C as illustrated in FIG. 21, in accordance with some embodiments. In FIG. 21, the lower part 202 and the upper part 204 of the lid structure 200 are illustrated as separated parts for convenient discussion purposes, and they may be attached to each other. In FIG. 20A, the cavity 180 may include a space enclosed by the top surface of the heat dissipation structure 60, the sealant 162, and the lid structure 200. The cavity 180 may also include the micro-channels 126. The cavity 180 may allow a cooling fluid to flow in to exchange heat from heat dissipation structure 60, thereby dissipating the heat generated by the integrated circuit die 50. The micro-channels 126 may enlarge the surface area of the heat dissipation structure 60 and increase the efficiency and capacity of exchanging heat between the heat dissipation structure 60 and the cooling fluid. The cooling fluid may be water, fluorocarbons, chlorocarbons, ethylene glycol, propylene glycol, a combination thereof, or other suitable cooling materials.

Referring to FIGS. 20A, 20B, and 21, the lid structure 200 may include a lower part 202 and an upper part 204 over the lower part 202. In some embodiments, the lower part 202 and the upper part 204 are separately manufactured and attached to each other by screws, adhesive, or other possible ways. The lid structure 200 may include one or more first cooling passages 210. Each of the first cooling passages 210 may include inlet/outlet openings 212 in the upper part 204 and first channels 214 and second channels 216 extending from the inlet/outlet openings 212 to the lower part 202. In some embodiments, the first channels 214 and the second channels 216 extend through the lower part 202 and connect to the cavity 180. For example, each of the first channels 214 and each of the second channels 216 may have an opening at the bottom of the lid structure 200.

As shown in FIG. 21, four of the first cooling passages 210 are illustrated in FIG. 21, though more or less of the first cooling passages 210 may be used. In some embodiments, each of the first cooling passages 210 has two inlets/outlet openings 212 (e.g., one inlet opening and one outlet opening). The two inlet/outlet openings 212 may be disposed at a first side 204A of the upper part 204 of the lid structure 200 at different heights (e.g., different locations in the z-direction). In some embodiments, each of the first cooling passages 210 may include a first channel 214 extending from one of the inlet/outlet openings 212 to a bottom of the lid structure 200 and a second channel 216 extending from another inlet/outlet opening 212 to the bottom of the lid structure 200. For example, the first channel 214 may include a first portion 214A extending from one of the inlet/outlet openings 212 to a central area of the lid structure 200 within the upper part 204, such as to a first position that is aligned to the heat dissipation structure 60 or the cavity 180 in a plan view. In some embodiments, the first portion 214A of the first channel 214 extends horizontally, though it may extend non-horizontally. The first channel 214 may also include a second portion 214B extending from the first portion 214A of the first channel 214 and through the upper part 204. The first channel 214 may also include a third portion 214C connecting to the second portion of the first channel 214 and extending through the lower part 202, to the bottom of the lid structure 200 for connecting to the cavity 180. The second portion 214B and the third portion 214C of the first channel 214 may extend vertically, though they may extend non-vertically. In some embodiments, the second portion 214B and the third portion 214C of the first channel 214 may have different cross-sectional shapes, though they may have a same cross-sectional shape. For example, as illustrated in FIG. 21, the second portion 214B of the first channel 214 may have a circular shape, and the third portion 214C of the first channel 214 may have an oval-like shape. The third portion 214C of first channel 214 may have a greater size than the second portion 214B of the first channel 214. For example, the shape and/or size of the third portion 214C of the first channel 214 may be designed to be compatible with the cavity 180 for improving flow efficiency or achieving uniform flow (e.g., by 3D-print, molding, or milling), and the second portion 214B may be formed by a low-cost manufacturing method (e.g., drilling) for reducing the manufacturing cost of the lid structure 200.

The second channel 216 may include a first portion 216A extending from another inlet/outlet openings 212 to the central area of the lid structure 200 within the upper part 204, such as to a second position that is aligned to the heat dissipation structure 60 or the cavity 180 and offset from the first position of the first channel 214 in a plan view. In some embodiments, the first portion 216A of the second channel 216 extends horizontally, though it may extend non-horizontally. The second channel 216 may also include a second portion 216B extending from the first portion 216A of the second channel 216 and through the upper part 204. The second channel 216 may also include a third portion 214C connecting to the second portion 216B of the second channel 216 and extending through the lower part 202, to the bottom of the lid structure 200 for connecting to the cavity 180. The second portion 216B and the third portion 216C of the second channel 216 may extend vertically, though they may extend non-vertically. In some embodiments, the second portion 216B and the third portion 216C of the second channel 216 may have different cross-sectional shapes, though they may have a same cross-sectional shape. For example, as illustrated in FIG. 21, the second portion 216B of the second channel 216 may have a circular shape, and the third portion 216C of the second channel 216 may have an oval-like shape. The third portion 216C of the second channel 216 may have a greater size than the second portion 216B of the second channel 216. For example, the shape and/or size of the third portion 216C of the second channel 216 may be designed to achieve uniform flow (e.g., by 3D-print, molding, or milling) so as the provide better heat exchange efficiency to the second integrated circuit devices 80B, and the second portion 216B may be formed by a low-cost manufacturing method (e.g., drilling) for reducing the manufacturing cost of the lid structure 200.

Direction 219 as illustrated in FIG. 21 shows an exemplary flowing path of cooling fluid in the lid structure 200 and the cavity 180, such as through the first cooling passage 210, in accordance with some embodiments. For example, the cooling fluid may flow into the lid structure 200 from one of the inlet/outlet openings 212, through the first channel 214 to cavity 180 for exchanging heat with the heat dissipation structure 60, and flow back to and out of the lid structure 200 through the second channel 216 and another inlet/outlet opening 212. It is appreciated that the cooling fluid may also flow in a direction opposite to the direction 219 as illustrated in FIG. 21. In some embodiments, a substantial amount of the heat generated by the integrated circuit die 50 is dissipated by cooling fluid flowing through the first cooling passages 210 and the cavity 180.

The lid structure 200 may also include one or more second cooling passages 220 extending in the lower part 202 and the upper part 204 of the lid structure 200. For example, two of the second cooling passages 220 are illustrated in FIG. 21. In some embodiments, each of the second cooling passages 220 has an inlet/outlet opening 222 disposed at a second side 204B of the upper part 204 and an inlet/outlet opening 222 disposed at a third side 204C of the upper part 204 opposite the second side 204B. The two inlet/outlet openings 222 may be disposed at the same level (e.g., similar locations in the z-direction). Each of the second cooling passages 220 may include a first upper channel 224 extending from one of the inlet/outlet openings 222 and a second upper channel 226 extending from another inlet/outlet opening 222. The first upper channel 224 includes a first portion 224A and a second portion 224B. The first portion 224A of the first upper channel 224 may extend to a peripheral area of the lid structure 200, such as to a third position aligned to one of the second integrated circuit devices 80B (see FIG. 20A) or the adhesive 166. In some embodiments, the first portion 224A of the first upper channel 224 extends horizontally, though it may extend non-horizontally. The second portion 224B of the first upper channel 224 may extend from the first portion 224A of the first upper channel 224 and through the upper part 204. The second upper channel 226 includes a first portion 226A and a second portion 226B. The first portion 226A of the second upper channel 226 may extend to the peripheral area of the lid structure 200, such as to a fourth position aligned to one of the second integrated circuit devices 80B (see FIG. 20A) or the adhesive 166 and offset from the third position of first upper channel 224. In some embodiments, the first portion 226A of the second upper channel 226 extends horizontally, though it may extend non-horizontally. The second portion 226B of the second upper channel 226 may extend from the first portion 226A of the second upper channel 226 and through the upper part 204.

Each of the second cooling passages 220 also includes one or more lower channels 228, in accordance with some embodiments. For example, FIG. 21 shows three of the lower channels 228 extending in a y-direction and connected to the first upper channel 224 and the second upper channel 226, though any number of the lower channels 228 may be used. The lower channels 228 may extend horizontally in the lower part 202. The lower channels 228 may extend over the first upper channel 224 or the second upper channel 226 in a plan view (e.g., in the y-direction). The lower channels 228 may also extend beyond edges of the second integrated circuit devices 80B in a length direction (e.g., y-direction in FIG. 21) of the second integrated circuit devices 80B. In some embodiments, the lower channels 228 further extend beyond edges of the encapsulant 90 in the y-direction of FIG. 21. In some embodiments, the lower channels 228 have an overall width (including the widths of the lower channels 228 and gaps therebetween) greater than or equal to a width of the adhesive 166 in the x-direction. In some embodiments, the lower channels 228 extend from an interface between the upper part 204 and the lower part 202 to a depth that is less than the thickness of the lower part 202. For example, the bottom of the lower channels 228 may be distant from the bottom of the lower part 202, such as having a distance D ranging from 100 um to 1000 um between them. As such, with the suitable distance D, heat may be efficiently dissipated from the second integrated circuit device 80B and the adhesive 166 while reducing the risk that the cooling fluid leaks to the adhesive 166 and results in leakage.

In some embodiments, a first seal ring 240 is disposed between the upper part 204 and the lower part 202 and around the first cooling passage 210. The first seal ring 240 may be an elastic material. In some embodiments, a second seal ring 242 is disposed in the lower part 202 and around the second cooling passage 220. The second seal ring 242 may be an elastic material. The first sealing ring 240 and the second seal ring 242 may increase the sealing for the first cooling passages 210 and the second cooling passages 220, respectively.

Direction 229 as illustrated in FIG. 21 shows an exemplary flowing path of cooling fluid in the lid structure 200, such as through the second cooling passage 220, in accordance with some embodiments. For example, the cooling fluid may flow into the lid structure 200 from one of the inlet/outlet openings 222, through the first upper channel 224 to the lower channels 228 for exchanging heat with the adhesive 166, and flow out of the lid structure 200 through the second upper channel 226 and another inlet/outlet opening 222. It is appreciated that the cooling fluid may also flow in a direction opposite to the direction 229 as illustrated in FIG. 21. In some embodiments, a substantial amount of the heat generated by the second integrated circuit devices 80B is dissipated by cooling fluid flowing through the second cooling passages 220.

In some embodiments, a bulk material of the lid structure 200 includes a metal or a metal alloy, such as aluminum, copper, nickel, cobalt, silver, titanium, iron, an alloy thereof, or a combination thereof; or other suitable materials, such as silicon carbide, aluminum nitride, graphite, a combination thereof, or the like. The first cooling passages 210 and the second cooling passages 220 may be formed in the bulk material of the lid structure 200 using a drilling technique (e.g., mechanical drilling or laser drilling) or a milling technique. Alternatively, the first cooling passages 210 and the second cooling passages 220 may be formed by molding or 3D printing together with the formation of the bulk material of the lid structure 200. In an embodiment, portions of the first cooling passages 210 and portions of the second cooling passages 220 in the upper part 204 are formed by the drilling technique, and portions of the first cooling passages 210 and portions of the second cooling passages 220 in the lower part 202 are formed by the milling technique, molding, or 3D printing.

The lower part 202 and the upper part 204 are attached by screws in accordance with some embodiments. In such embodiments, the lower part 202 and upper part 204 each includes holes 230 for the screws to penetrate through for attaching the lower part 202 and the upper part 204. For example, a direction 232 is illustrated in FIG. 21 to show the route where the screws may penetrate through the holes 230. The holes 230 may be disposed at corners or places near the corners of the lower part 202 and the upper part 204. In some embodiments, a first seal ring 240 is disposed in both of the lower part 202 and the upper part 204 and around the first cooling passages 210. The first seal ring 240 may be formed of an elastic material, such as rubber, metal gasket, sealant, combinations thereof, or the like. The first seal ring 240 may be deformed to seal seams between the lower part 202 and the upper part 204 and may provide an enhanced sealing performance for the first cooling passages 210, thereby reducing or preventing the leakage of the cooling fluid of the first cooling passages 210. In some embodiments, a second seal ring 242 is disposed in the lower part 202 (or in both of the lower part 202 and the upper part 204) and around the second cooling passages 220. The second seal ring 242 may be formed of an elastic material, such as rubber, metal gasket, sealant, combinations thereof, or the like. The second seal ring 242 may be deformed to seal seams between the lower part 202 and the upper part 204 and may provide an enhanced sealing performance for the second cooling passages 220, thereby reducing or preventing the leakage of the cooling fluid of the second cooling passages 220.

When the integrated circuit package 100 is in operation, the cooling fluid may continuously flow through the first cooling passages 210, the second cooling passages 220, and the cavity 180 (including the micro-channels 126). As such, the cooling fluid may effectively conduct the heat generated by the integrated circuit device 80 away, thereby improving the performance of the integrated circuit package 100.

Figure 22C:
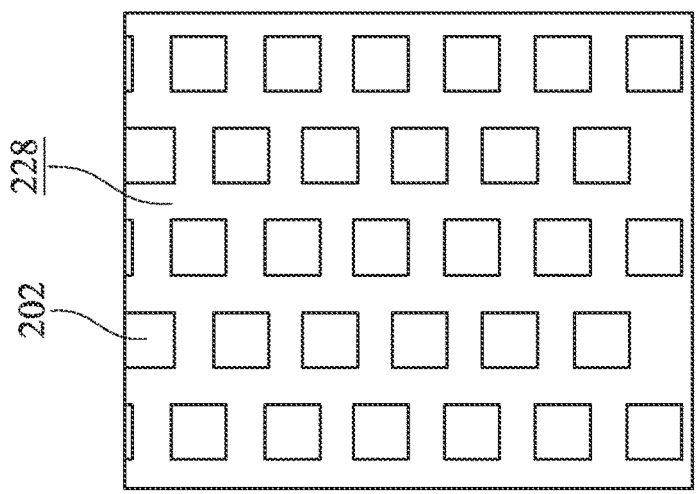
FIGS. 22A-22C are plan views of channels of a lid structure, in accordance with some embodiments.
Figure 22B:
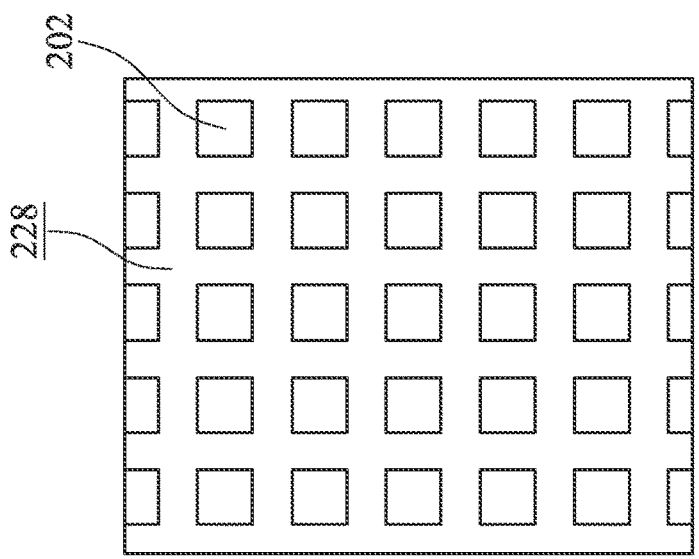
Figure 22A:
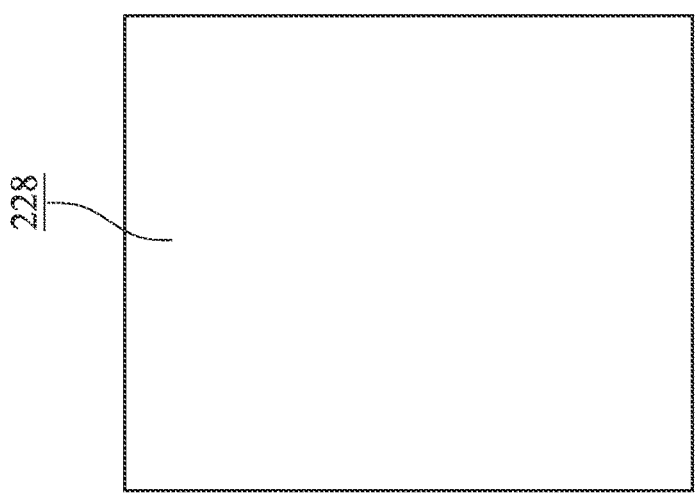

Although FIGS. 20A and 21 shows three of the lower channels 228 of the second cooling passages 220 extending in the y-direction (e.g., each lower channel 228 may have a rectangular shape in a plan view), the lower channels 228 may have any suitable pattern. For example, FIGS. 22A to 22C illustrate plan views of the lower channels 228 in alternative configurations, in accordance with some embodiments. In FIG. 22A, the lower channels 228 may have a plate shape, which may have a rectangular or a shape similar to a rectangular shape that has a length (e.g., y-direction in FIG. 21) and a width (e.g., x-direction in FIG. 21) greater than the length (e.g., y-direction in FIG. 21) and the width (e.g., x-direction in FIG. 21) of the adhesive 166, respectively. In FIG. 22B, the lower channels 228 may have a grid shape, where the lower channels 228 include a first portion of micro-channels and a second portion of micro-channels substantially perpendicular to each other and crossing each other. In FIG. 22C, the lower channels 228 may have a grid-like shape, where the lower channels 228 are formed between staggering pillars of the lower part 202 of the lid structure 200. The staggering pillars may be formed of the bulk material of the lid structure 200.

A package including a lid structure attached to a first integrated circuit device and a second integrated circuit device through a sealant and an adhesive is provided. The lid structure may include a first cooling passage for connecting to a cavity enclosed by the first integrated circuit device, the adhesive, and the lid structure so as to allow a cooling fluid flow to the cavity for effectively dissipating heat generated by the first integrated circuit device. The lid structure also includes a second cooling passage that includes channels horizontally flowing over the second integrated circuit device and distant from the adhesive and the second integrated circuit device for dissipating heat generated by the second integrated circuit device while reducing or preventing leakage of the cooling fluid from the second cooling passage. Because heat generated by the first integrated circuit device and the second integrated circuit device may be effectively dissipated through the cooling fluid through the cavity and the lid structure, the performance of the package may be improved.

In an embodiment, a package includes an encapsulant laterally surrounding a first integrated circuit device and a second integrated circuit device, wherein the first integrated circuit device includes a die and a heat dissipation structure over the die; a sealant disposed over the heat dissipation structure; an adhesive disposed over the second integrated circuit device; and a lid disposed over the sealant and the adhesive, wherein the lid includes a first cooling passage and a second cooling passage, the first cooling passage including an opening at a bottom of the lid and aligned to the heat dissipation structure, the second cooling passage including channels aligned to the second integrated circuit device and being distant from the bottom of the lid. In an embodiment, the sealant includes silicone, epoxy, polytetrafluoroethylene, polysulfide, polyurethane, or combinations thereof. In an embodiment, the adhesive includes a thermal interface material. In an embodiment, the adhesive is in physical contact with the second integrated circuit device. In an embodiment, the package includes a cavity enclosed by the lid, the sealant, and the heat dissipation structure. In an embodiment, the cavity includes a plurality of channels extending in the heat dissipation structure. In an embodiment, the first cooling passage connects to the cavity. In an embodiment, the package includes a first elastic ring encircling a portion of the first cooling passage in a plan view. In an embodiment, the package includes a second elastic ring encircling a portion of the second cooling passage in a plan view.

In an embodiment, a package includes a first integrated circuit device and a second integrated circuit device attached to a substrate, wherein the first integrated circuit device includes a die and a heat dissipation structure disposed over the die; a sealant disposed over the heat dissipation structure; an adhesive disposed over the second integrated circuit device; and a lid disposed over the sealant and the adhesive, wherein the lid includes a lower part, an upper part over the lower part, a first cooling passage in the lower part and the upper part, and a second cooling passage in the lower part and the upper part and spaced apart from the first cooling passage, wherein the first cooling passage includes a first upper channel in the upper part and a first lower channel extending through the lower part and aligned to the first integrated circuit device, wherein the second cooling passage includes a second upper channel in the upper part and a second lower channel in the lower part, wherein the second lower channel is connected to the first upper channel and extends beyond the first upper channel in a plan view, wherein the second lower channel overlaps the adhesive in the plan view. In an embodiment, the package includes a cavity enclosed by the lid, the sealant, and the heat dissipation structure, wherein the cavity includes a plurality of channels extending into the heat dissipation structure. In an embodiment, the first cooling passage includes a first opening and a second opening at a first side of the lid, wherein the first opening and the second opening are at different heights. In an embodiment, the second cooling passage includes a third opening at a second side of the lid and a fourth opening at a third side of the lid opposite the second side of the lid. In an embodiment, the third opening and the fourth opening are at a same height. In an embodiment, a bottom of the second cooling passage is distant from a bottom of the lid.

In an embodiment, a method for forming a package is provided. The method includes forming an encapsulant laterally surrounding a first integrated circuit device and a second integrated circuit device, wherein the first integrated circuit device includes a die and a heat dissipation structure over the die, wherein the heat dissipation structure includes channels on a first side of the heat dissipation structure; disposing a sealant over the heat dissipation structure; disposing an adhesive over the second integrated circuit device; and disposing a lid over the sealant and the adhesive, wherein the lid includes a first cooling passage and a second cooling passage, the first cooling passage including an opening at a bottom of the lid and aligned to the channels in the heat dissipation structure, the second cooling passage including horizontal channels aligned to the second integrated circuit device and being distant from the bottom of the lid. In an embodiment, disposing the lid over the sealant and the adhesive forms a cavity enclosed by the lid, the sealant, and the heat dissipation structure. In an embodiment, the method further includes filling the channels with a sacrificial material before forming the encapsulant and removing the sacrificial material before disposing the lid. In an embodiment, the first cooling passage and the second cooling passage are formed by drilling a bulk material of the lid. In an embodiment, the lid is formed using molding or 3D print.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
an encapsulant laterally surrounding a first integrated circuit device and a second integrated circuit device, wherein the first integrated circuit device comprises a die and a heat dissipation structure over the die;
a sealant disposed over the heat dissipation structure;
an adhesive disposed over the second integrated circuit device; and
a lid disposed over the sealant and the adhesive, wherein the lid comprises a first cooling passage and a second cooling passage, the first cooling passage comprising an opening at a bottom of the lid and aligned to the heat dissipation structure, the second cooling passage comprising channels aligned to the second integrated circuit device and being distant from the bottom of the lid.

2. The package of claim 1, wherein the sealant comprises silicone, epoxy, polytetrafluoroethylene, polysulfide, polyurethane, or combinations thereof.

3. The package of claim 1, wherein the adhesive comprises a thermal interface material.

4. The package of claim 1, wherein the adhesive is in physical contact with the second integrated circuit device.

5. The package of claim 1, further comprising a cavity enclosed by the lid, the sealant, and the heat dissipation structure.

6. The package of claim 5, wherein the cavity comprises a plurality of channels extending in the heat dissipation structure.

7. The package of claim 5, wherein the first cooling passage connects to the cavity.

8. The package of claim 1, further comprising a first elastic ring encircling a portion of the first cooling passage in a plan view.

9. The package of claim 1, further comprising a second elastic ring encircling a portion of the second cooling passage in a plan view.

10. A package, comprising:
a first integrated circuit device and a second integrated circuit device attached to a substrate, wherein the first integrated circuit device comprises a die and a heat dissipation structure disposed over the die;
a sealant disposed over the heat dissipation structure;
an adhesive disposed over the second integrated circuit device; and
a lid disposed over the sealant and the adhesive, wherein the lid comprises a lower part, an upper part over the lower part, a first cooling passage in the lower part and the upper part, and a second cooling passage in the lower part and the upper part and spaced apart from the first cooling passage, wherein the first cooling passage comprises a first upper channel in the upper part and a first lower channel extending through the lower part and aligned to the first integrated circuit device, wherein the second cooling passage comprises a second upper channel in the upper part and a second lower channel in the lower part, wherein the second lower channel is connected to the first upper channel and extends beyond the first upper channel in a plan view, wherein the second lower channel overlaps the adhesive in the plan view.

11. The package of claim 10, further comprising a cavity enclosed by the lid, the sealant, and the heat dissipation structure, wherein the cavity comprises a plurality of channels extending into the heat dissipation structure.

12. The package of claim 10, wherein the first cooling passage comprises a first opening and a second opening at a first side of the lid, wherein the first opening and the second opening are at different heights.

13. The package of claim 10, wherein the second cooling passage comprises a third opening at a second side of the lid and a fourth opening at a third side of the lid opposite the second side of the lid.

14. The package of claim 13, wherein the third opening and the fourth opening are at a same height.

15. The package of claim 10, wherein a bottom of the second cooling passage is distant from a bottom of the lid.

16. A package, comprising:
an interposer attached to a substrate;
a first integrated circuit device attached to the interposer, the first integrated circuit device comprising a semiconductor die and a heat dissipation structure over the semiconductor die, wherein the heat dissipation structure comprises a micro-channel;
a second integrated circuit device attached to the interposer, the second integrated circuit device being free of micro-channels;
an encapsulant laterally surrounding the first integrated circuit device and the second integrated circuit device;
a ring structure attached to the substrate and laterally surrounding the encapsulant; and a lid disposed over the first integrated circuit device and the second integrated circuit device, wherein the lid comprises:
  a first cooling passage having a first inlet opening and a first outlet opening, wherein the first cooling passage is aligned with the micro-channel of the heat dissipation structure; and
  a second cooling passage having a second inlet opening and a second outlet opening, the second cooling passage being disposed over the second integrated circuit device.

17. The package of claim 16, wherein the lid is disposed over the ring structure.

18. The package of claim 16, further comprising an adhesive between the lid and the second integrated circuit device.

19. The package of claim 16, wherein the ring structure comprises a metal or metal alloy.

20. The package of claim 16, wherein the second cooling passage is spaced apart from the second integrated circuit device.

* * * * *